(12) United States Patent
Razumnaya et al.

(10) Patent No.: US 12,727,166 B2
(45) Date of Patent: Sep. 1, 2026

(54) FERROELECTRIC NANOPARTICLE CAPACITOR FOR NON-BINARY LOGICS

(71) Applicant: Terra Quantum AG, St. Gallen (CH)

(72) Inventors: Anna Razumnaya, St. Gallen (CH); Yurii Tikhonov, St. Gallen (CH); Igor Lukyanchuk, St. Gallen (CH); Valerii Vinokour, St. Gallen (CH)

(73) Assignee: Terra Quantum AG, St. Gallen (CH)

( * ) Notice: Subject to any disclaimer, the term of this patent is extended or adjusted under 35 U.S.C. 154(b) by 380 days.

(21) Appl. No.: 18/376,788

(22) Filed: Oct. 4, 2023

(65) Prior Publication Data

US 2024/0120366 A1 Apr. 11, 2024

(30) Foreign Application Priority Data

Oct. 11, 2022 (EP) .................................... 22200942

(51) Int. Cl.
*H10B 53/30* (2023.01)
*B82Y 30/00* (2011.01)
(Continued)

(52) U.S. Cl.
CPC ............. *H10B 53/30* (2023.02); *G06N 3/045* (2023.01); *G11C 11/221* (2013.01); *G11C 11/54* (2013.01);
(Continued)

(58) Field of Classification Search
CPC ........ H10B 53/30; H10B 51/30; G06N 3/045; G06N 3/044; G06N 3/063; G06N 3/04; G06N 3/08; G11C 11/221; G11C 11/54; G11C 11/5657; G11C 11/2275; H03K 19/185; H10D 1/682; H10D 1/694;
(Continued)

(56) References Cited

U.S. PATENT DOCUMENTS

2003/0142533 A1 7/2003 Ueda et al.
2004/0095658 A1 * 5/2004 Buretea .................. H10F 77/45 359/853
(Continued)

FOREIGN PATENT DOCUMENTS

DE 102008030035 A1 * 2/2010 ............. B01J 35/33
JP 2003-163332 A 6/2003
(Continued)

OTHER PUBLICATIONS

Lee et al., A Novel Ferroelectric Nanopillar Mutli-Level Cell Memory, Sep. 6, 2022, SISPAD 2022 International Conference on Simulation of Semiconductor Processes and Devices (Session 1A: Magnetism), pp. 5-6 (Year: 2022).*
(Continued)

*Primary Examiner* — William B Partridge
*Assistant Examiner* — Erik A. Anderson
(74) *Attorney, Agent, or Firm* — Fitch Even Tabin & Flannery LLP

(57) ABSTRACT

A ferroelectric nanoparticle capacitor-device comprises a pair of conductive elements electrically insulated from each other, and ferroelectric nanoparticles arranged between the conductive elements of the pair. The ferroelectric nanoparticles are adapted to provide at least three polarization states with different total ferroelectric polarizations.

15 Claims, 13 Drawing Sheets

Figure 1:
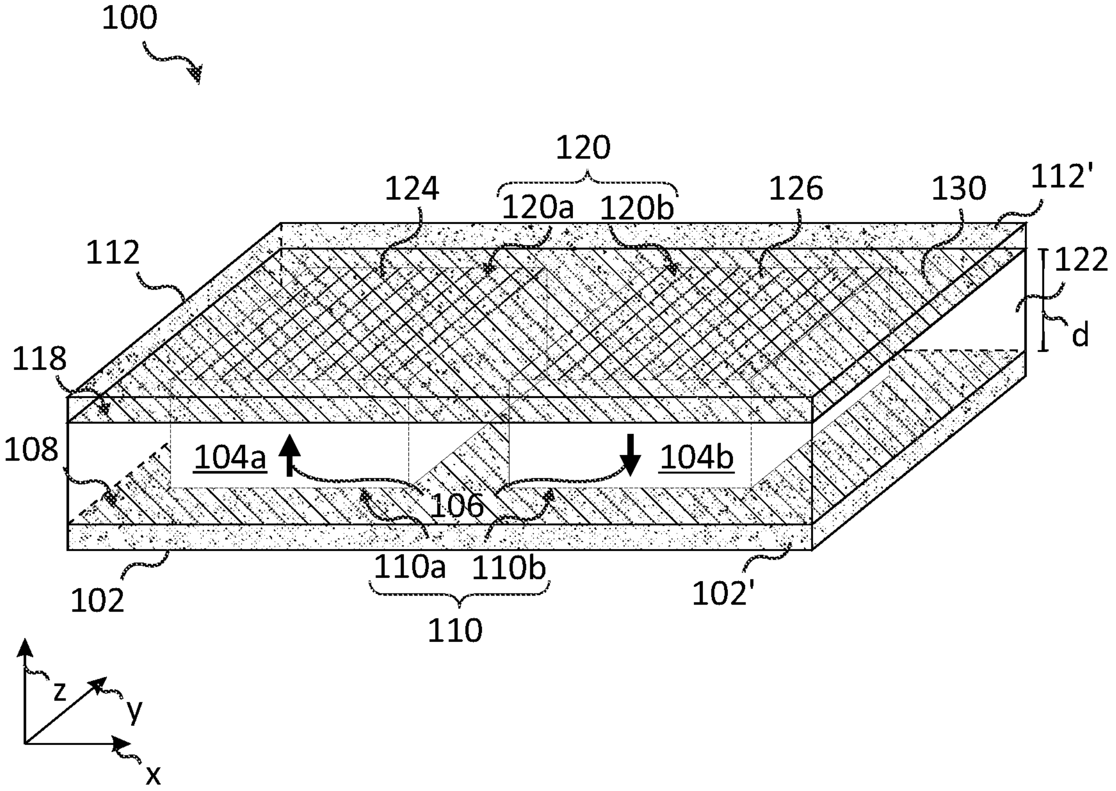

(51) Int. Cl.

| | |
|---|---|
| ***G06N 3/045*** | (2023.01) |
| ***G11C 11/22*** | (2006.01) |
| ***G11C 11/54*** | (2006.01) |
| ***G11C 11/56*** | (2006.01) |
| ***H03K 19/185*** | (2006.01) |
| ***H10D 1/68*** | (2025.01) |

(52) U.S. Cl.
CPC ........ *G11C 11/5657* (2013.01); *H03K 19/185* (2013.01); *H10D 1/682* (2025.01); *H10D 1/694* (2025.01); *B82Y 30/00* (2013.01)

(58) Field of Classification Search
CPC .... H10D 30/0415; H10D 30/701; H10D 1/68; H10D 1/041; H10D 62/118; H10D 64/033; H10D 64/689; H10D 1/692; B82Y 30/00; H01G 4/10; H01G 4/33; H01G 7/06; H01G 4/40; H01L 23/642
See application file for complete search history.

(56) References Cited

U.S. PATENT DOCUMENTS

| | | | | |
|---|---|---|---|---|
| 2007/0138522 | A1* | 6/2007 | Kijima | H10D 1/684<br>257/295 |
| 2010/0072527 | A1 | 3/2010 | Ozaki | |
| 2016/0172113 | A1* | 6/2016 | Reig | H10D 1/696<br>361/278 |
| 2019/0296122 | A1 | 9/2019 | Ino et al. | |
| 2020/0091160 | A1 | 3/2020 | Ino et al. | |
| 2021/0035993 | A1* | 2/2021 | Chen | H10B 53/40 |
| 2021/0066318 | A1* | 3/2021 | Chang | G11C 11/5657 |
| 2021/0098060 | A1* | 4/2021 | Ni | H10B 53/30 |

FOREIGN PATENT DOCUMENTS

| | | | |
|---|---|---|---|
| JP | 2006-269611 | A | 10/2006 |
| JP | 2010-080520 | A | 4/2010 |
| JP | 2019-169574 | A | 10/2019 |
| JP | 2020-047796 | A | 3/2020 |
| WO | 03/001599 | A1 | 1/2003 |

OTHER PUBLICATIONS

Baudry et al., "Ferroelectric Symmetry-Protected Multibit Memory Cell," *Sci. Rep.* 7, 42196 (2017).

Lee et al., "A Novel Ferroelectric Nanopillar Multi-Level Cell Memory," *Intl. Conference on Simulation of Semiconductor Processes and Devices* (Sep. 6, 2022).

Lee et al., "A Novel Ferroelectric Nanopillar Multi-Level Cell Memory," *Solid State Electronics*, 200 (Nov. 23, 2022).

Wang et al., "Mechanically Induced Ferroelectric Switching in BATiO3 Thin Films," *ACTA Materialia*, 193, 151-162 (May 3, 2020).

Japan Patent Office, Office Action in Japanese Patent Application No. 2023-171178, 16 pp. (Dec. 10, 2024).

Chen et al. "All-ferroelectric implementation of reservoir computing" *Nature Comm.*, 14(1) (2023).

Paruch "Nanoscale control of ferroelectric polarization and domain size in epitaxial $Pb(Zr_{0.2}Ti_{0.8})\ O_3$ thin films" *Applied Physics Lett*, 530-532, 79(4) (2021).

Yang et al. "Light-Induced Reversible Control of Ferroelectric Polarization in $BiFeO_3$" *Advanced Materials*, (30)14 (2018).

European Patent Application No. 23 19 7777, Search Report (May 17, 2024).

European Patent Office; Extended European Search Report dated Jan. 19, 2023; from related European Patent Application No. 22200942.5, 12 pages.

* cited by examiner

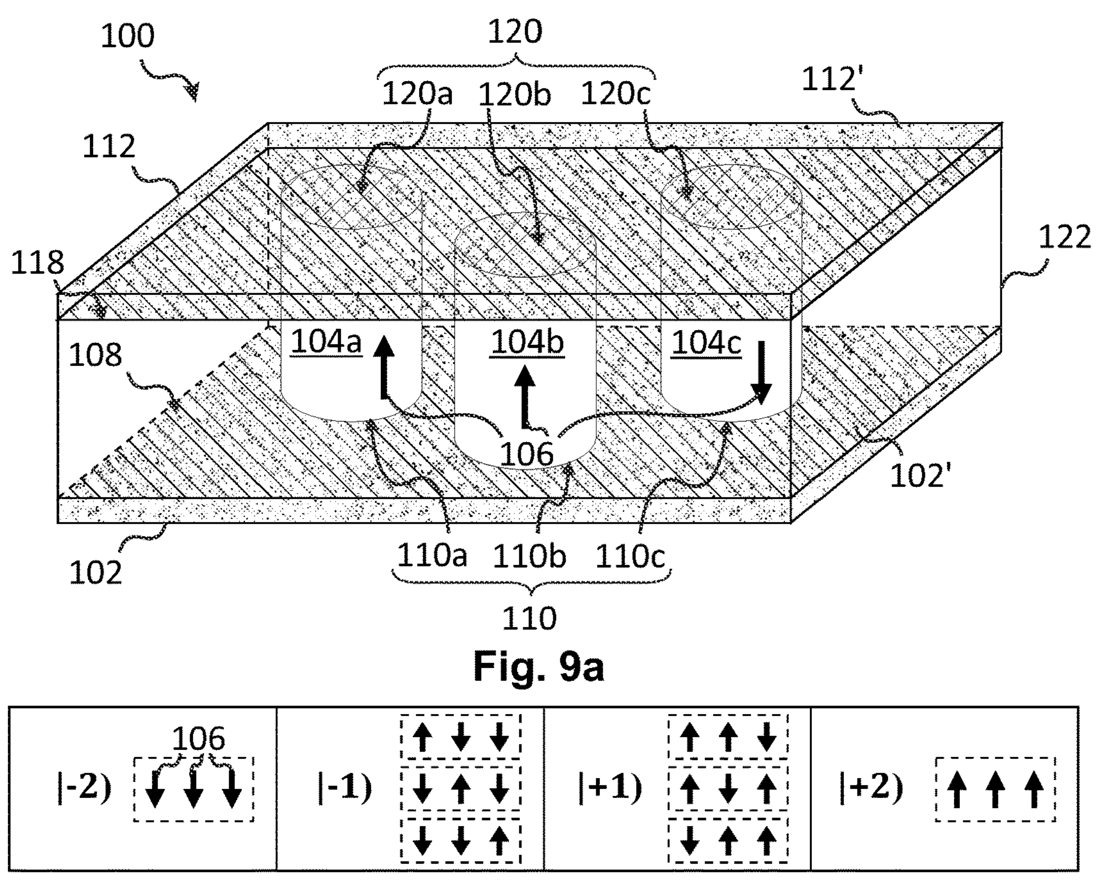
Fig. 9a
Fig. 9b
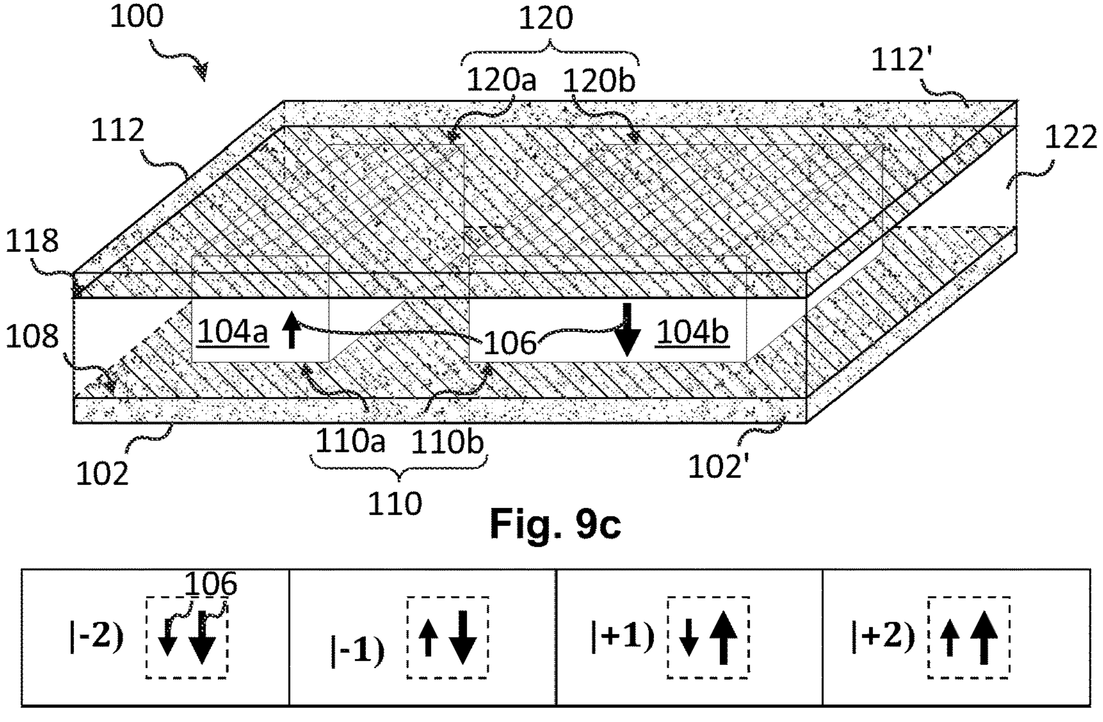
Fig. 9c
Fig. 9d

FERROELECTRIC NANOPARTICLE CAPACITOR FOR NON-BINARY LOGICS

CROSS-REFERENCE TO RELATED APPLICATIONS

The instant application claims priority to European Patent Application Nos. 22200942.5, filed Oct. 11, 2022, which is incorporated herein in its entirety by reference.

FIELD OF THE DISCLOSURE

The present disclosure generally relates to a ferroelectric nanoparticle capacitor device with a limited number of ferroelectric nanoparticles to provide discrete remanent ferroelectric polarization states that may be addressed individually.

BACKGROUND OF THE INVENTION

The computer industry aims at a continuous miniaturization of devices to reduce the energy required for storing or switching a piece of information such as a logical bit. For this purpose, the existing computing circuits employ the standard binary logic for storage and processing information. These circuits are reaching their fundamental limitations set by the atomic size miniaturization and by the fundamental Landauer principle of energy dissipation per bit processing.

BRIEF SUMMARY OF THE INVENTION

The present disclosure describes use of nanoparticles in a monodomain ferroelectric state. The disclosure also relates to a method for setting the polarization state of ferroelectric nanoparticles.

In view of the technical problems laid out above, there is a need for a multi-value logic device. In the context of this disclosure, the term multi-value logic device may refer to a device that provides at least three states, such as at least three switchable and/or individually addressable logic states or at least three switchable and/or individually addressable polarization states. In other words, the multi-value logic device may be considered a nonbinary logic device. The multi-value logic device is therefore distinct from a binary logic device, which provides two states (i.e., two logic states or polarization states, which are switchable and/or individually addressable).

Employing a multi-value logic device may reduce energy losses and permit an unprecedentedly high information density of the device, and thus overcome the binary tyranny of conventional devices. Exploring the multi-value logics is crucial for realizing non-von Neumann computing.

Despite an active search for systems capable to realize switchable multi-value logics, a practically viable physical implementation of a multi-value logic device has previously remained an unresolved daunting task.

Existing implementations of pseudo-multi-level logic units, that are currently used in solid-state drives and flash memories, actually comprise a combination of individual binary (i.e., bit) logic devices. Therefore, they require the analogue methods of bit writing, which may lead to erratic behavior of the logic cells due to stochastic loss of information.

In a first aspect of the present disclosure, a ferroelectric nanoparticle capacitor-device comprises a pair of conductive elements electrically insulated from each other, and ferroelectric nanoparticles arranged between the conductive elements of the pair. The ferroelectric nanoparticles are adapted to provide at least three polarization states with different total ferroelectric polarizations.

The ferroelectric nanoparticle capacitor-device according to the first aspect therefore provides a multi-value logic device, or an implementation of a multi-value logic, respectively. The ferroelectric nanoparticle capacitor-device may be adapted to selectively set the ferroelectric nanoparticles to any of the at least three polarization states. For example, the ferroelectric nanoparticle capacitor-device may be adapted to receive a preselected voltage or a preselected charge at one of the conductive elements of the pair to selectively set the ferroelectric nanoparticles to any of the at least three polarization states, in particular wherein the other conductive element of the pair is adapted to carry a constant electrical charge. In other words, the polarization states of the ferroelectric nanoparticles can be individually addressed. Addressing a polarization state may refer to setting the ferroelectric nanoparticles to the respective polarization state.

The ferroelectric nanoparticle capacitor-device therefore constitutes a multi-value logic device, where each polarization state serves as a state (e.g., as a memory level) of the multi-value logic, and the switching by the application of the charge represents the transition between the states, or between the memory levels, respectively.

The ferroelectric nanoparticles may be adapted to provide at most 64 discrete polarization states with different total ferroelectric polarizations, in particular at most 32 discrete polarization states with different total ferroelectric polarizations, in particular at most 16 discrete polarization states with different total ferroelectric polarizations, in particular at most 8 discrete polarization states with different total ferroelectric polarizations, in particular at most 4 discrete polarization states with different total ferroelectric polarizations.

To individually address any of the polarization states, or switch between any pair of polarization states, the ferroelectric nanoparticle capacitor-device may provide a respective route, wherein the route is well-defined and specific to the polarization state to be addressed, or to the pair of polarization states to be switched between, respectively. In the context of this disclosure, the term route may refer to a charge to be applied to at least one of the conductive elements, or to charges (i.e., different, such as by total value and/or sign) to be sequentially applied to the at least one of the conductive elements.

The at least three polarization states may be at least three remanent polarization states. In other words, the ferroelectric nanoparticles may be adapted to preserve any of the at least three polarization states and/or to preserve the set one of the at least three polarization states, in particular when no charge or voltage is applied to the conductive elements. This may allow to implement memory levels of a multi-value logic.

The polarization states may refer to overall polarization states of the ferroelectric nanoparticles, or, in other words, to polarization states of the entirety of the ferroelectric nanoparticles; for example, in contrast to an individual polarization state of an individual ferroelectric nanoparticle of the ferroelectric nanoparticles. The polarization state(s) may refer to ferroelectric polarization state(s). The polarization states may be discrete polarization states. For example, the at least three polarization states may be at least three discrete polarization states. The ferroelectric nanoparticles may be adapted to provide respective individual polarization states, in particular discrete individual polarization states such as a respective individual polarized-up and a respective individual polarized-down state. The individual polarization state(s) may refer to individual ferroelectric polarization state(s).

The ferroelectric nanoparticle capacitor-device may be adapted to switch an individual polarization state of an individual ferroelectric nanoparticle of the ferroelectric nanoparticles. The ferroelectric nanoparticle capacitor-device may be adapted to preserve the individual polarization states of the remaining ferroelectric nanoparticles while switching the individual polarization state of the individual ferroelectric nanoparticle. The ferroelectric nanoparticles may have an identical material composition. This may facilitate an economic fabrication of the device. The conductive elements may refer to electrically conductive elements. The conductive elements may be conductive layers and/or conductive plates.

A (in particular, each) ferroelectric nanoparticle of the ferroelectric nanoparticles may be arranged between first sections of the conductive elements. In other words, the first sections of the conductive elements may correspond to projections of the ferroelectric nanoparticle onto the conductive elements. The ferroelectric nanoparticle (or the ferroelectric nanoparticles, respectively) and the (respective) first sections of the conductive elements may define a ferroelectric capacitor (or ferroelectric capacitors, respectively).

At most 10 ferroelectric nanoparticles may be arranged between the conductive elements of the pair, or at most 5 ferroelectric nanoparticles, or at most 3 ferroelectric nanoparticles, or exactly 3 ferroelectric nanoparticles, or exactly 2 ferroelectric nanoparticles.

Respective limited numbers of nanoparticles may improve the reliability of the switching between the polarization states.

Sections of the conductive elements sandwiching one of the ferroelectric nanoparticles may define a respective ferroelectric capacitor. In other words, the ferroelectric nanoparticles and the sections of the conductive elements sandwiching the ferroelectric nanoparticles may define ferroelectric capacitors.

The conductive elements of the pair may comprise respective surfaces facing each other, and respective surface areas of the respective surfaces may each exceed an overall surface-projected area of the ferroelectric nanoparticles.

In other words, the conductive elements may comprise respective excess portions without a ferroelectric nanoparticle in between them.

In corresponding embodiments, the surface areas of the conductive elements exceeding the overall surface projected area of the ferroelectric nanoparticles (or sections of the respective surfaces without a ferroelectric nanoparticle in between them, respectively; or the excess portions of the conductive elements, respectively) may define a dielectric capacitor or a capacitance of a dielectric capacitor. The dielectric capacitor may be adapted to provide the dielectric capacitance. Sections of the respective surfaces without a ferroelectric nanoparticle in between them may refer to sections of the respective surfaces, wherein the ferroelectric nanoparticles fill less than 50%, in particular less than 40%, in particular less than 30%, in particular less than 20%, or in particular less than 10% of the distance between the respective surfaces.

The dielectric capacitor may be arranged electrically in parallel and/or in series to the ferroelectric capacitors. The dielectric capacitor and the ferroelectric capacitors, (or the capacitance of the dielectric capacitor and the capacitance of the ferroelectric capacitors, respectively) may be adapted to together define the routes between the at least three polarization states and/or to define a number of remanent polarization states.

The overall surface-projected area of the ferroelectric nanoparticles may correspond to an area of a projection of the ferroelectric nanoparticles onto one of the respective surfaces.

The respective surfaces of the conductive elements of the pair may each be continuous, e.g., with a round or elliptical or rectangular or polygonal or rounded polygonal shape.

The ferroelectric nanoparticles may be arranged between the respective surfaces.

The respective surfaces may comprise and/or define lateral directions parallel to the respective surfaces. In other words, the respective surfaces may extend laterally.

Each of the respective surface areas may exceed an overall surface-projected area of the ferroelectric nanoparticles by at least 5% or by at least 10% or by at least 30% or by at least 50% or by at least a factor of two.

The ferroelectric nanoparticles may be spaced apart from each other and/or a dielectric separator material may be arranged between the ferroelectric nanoparticles.

Corresponding embodiments may ensure discrete polarization states and/or discrete individual polarization states.

In corresponding embodiments, the dielectric separator material may be comprised in the dielectric capacitor and/or provide a dielectric of the dielectric capacitor.

At least a section of the dielectric separator material may be arranged between second sections of the conductive elements. In other words, the second sections of the conductive elements may correspond to projections of the at least section of the dielectric separator material onto the conductive elements. The at least section of the dielectric separator material and the second sections of the conductive elements may (i.e., according to an alternative definition) define the dielectric capacitor.

The dielectric separator material may be adapted to separate the conductive elements and/or to electrically insulate the conductive elements from each other.

The dielectric separator material may encircle at least one of the ferroelectric nanoparticles or encircle the ferroelectric nanoparticles, in particular laterally (i.e., along the lateral directions).

The conductive elements of the pair may comprise respective surfaces. The respective surfaces may be spaced apart by a distance. The ferroelectric nanoparticles may extend along at least 60% of the distance, or along at least 75% of the distance, or along at least 90% of the distance, or along the entire distance. Alternatively, or in addition, the respective surfaces may be connected by a reference line, and the ferroelectric nanoparticles may extend along the reference line. The distance may correspond to a length of the reference line.

The ferroelectric nanoparticles may be spaced apart from each other laterally (i.e., along the lateral directions).

A first ferroelectric nanoparticle of the ferroelectric nanoparticles may have a first size. A second ferroelectric nanoparticle of the ferroelectric nanoparticles may have a second size. The first size may be larger than the second size, in particular by at least 10% or by at least 30% or by at least 50% or by at least a factor of two.

The first size (or the second size, respectively) may refer to the maximum extension of the first ferroelectric nanoparticle (or of the second ferroelectric nanoparticle, respectively). In other words, the first size (or the second size, respectively) may refer to a size of the first ferroelectric nanoparticle (or of the second ferroelectric nanoparticle, respectively) along a direction, along which it is the largest.

Alternatively, the first size (or the second size, respectively) may refer to the volume of the first ferroelectric nanoparticle (or of the second ferroelectric nanoparticle, respectively).

The first (and/or second) ferroelectric nanoparticle may be arranged between first (and/or second) first sections of the conductive elements. In other words, the first (and/or second) first sections of the conductive elements may correspond to projections of the first (and/or second) ferroelectric nanoparticle onto the conductive elements. The first (and/or second) ferroelectric nanoparticle and the first (and/or second) first sections of the conductive elements may define a first (and/or a second) ferroelectric capacitor. The first (and/or second) ferroelectric capacitor may be adapted to provide a respective capacitance.

According to embodiments, respective sizes of the ferroelectric nanoparticles along any direction do not exceed 100 nm, in particular not exceed 50 nm or not exceed 30 nm or not exceed 20 nm or not exceed 10 nm or not exceed 5 nm. In the context of this disclosure, ferroelectric nanoparticles with sizes of up to 20 nm may also be referred to as ferroelectric nanodots.

Respective sizes of the ferroelectric nanoparticles may be beneficial for ensuring the monodomain ferroelectric states of the ferroelectric nanoparticles. In particular, defining the sizes of the ferroelectric nanoparticles may result in controlled coercive fields of the respective nanoparticles, and controlling the sizes thus gives control over the routes for addressing or switching between the polarization states. This is an advantage, for example, of using ferroelectric nanoparticles over using ferroelectric films in which ferroelectric domains form randomly, without good control over their size distribution. For the ferroelectric nanoparticles, narrow size tolerances or narrow size distributions may be achieved.

The respective sizes may correspond to the maximum extension or to the sizes of the ferroelectric nanoparticles along the direction, along which they are the largest, as described above in the context of the first size and the second size.

Respective minimum sizes of the ferroelectric nanoparticles along any direction may not be smaller than 4 nm or not be smaller than 3 nm or not be smaller than 2 nm or not be smaller than 1 nm.

The ferroelectric nanoparticles may comprise respective monodomain ferroelectric states.

The at least three polarization states may correspond to combinations of the respective monodomain ferroelectric states of the ferroelectric nanoparticles.

The respective monodomain ferroelectric states of the ferroelectric nanoparticles may be remanent and/or discrete polarization states.

A first conductive element of the pair may be adapted to carry a constant electrical charge and/or may be electrically insulated and/or electrically floating.

The ferroelectric nanoparticle capacitor-device may further comprise a charge control device adapted to control and/or change a charge on a second conductive element of the pair.

The ferroelectric nanoparticle capacitor-device may further comprise a transistor, wherein a channel of the transistor forms the first conductive element or the second conductive element.

The charge control device may comprise an additional conductive element electrically insulated from the pair of conductive elements. The charge control device may be adapted to apply a voltage between the additional conductive element and the second conductive element.

The additional conductive element and the second conductive element may be arranged on opposite sides of the first conductive element.

The additional conductive element may be separated from the first conductive element by a dielectric spacer.

The dielectric spacer may form a gate dielectric of the transistor.

The conductive elements and/or the additional conductive element may comprise or be composed of metal material or semiconductor material.

The at least three polarization states may be associated with respective voltage levels.

The respective voltage levels may refer to voltage levels of the first conductive element and/or of the second conductive element, or to a voltage difference between the first conductive element and the second conductive element.

The ferroelectric nanoparticle capacitor-device may further comprise a voltage readout element adapted to determine a voltage of the first conductive element and/or a voltage of the second conductive element, or a voltage difference between the first conductive element and second conductive element, such as to identify the respective voltage levels associated with the at least three polarization states.

The ferroelectric nanoparticle capacitor-device may further comprise a temperature-control element adapted to control and/or change a temperature of the ferroelectric nanoparticles. Alternatively, or in addition, the ferroelectric nanoparticle capacitor-device may comprise a force control element adapted to control and/or change a mechanical force applied to the ferroelectric nanoparticles.

The temperature-control element and/or the force control element may allow for a post-adjustment of the routes for addressing and/or switching the polarization states. For example, the temperature-control element and/or the force control element may allow for addressing a polarization state, such as a polarization state with a net polarization of zero, which may not be addressable by applying a charge or voltage to at least one of the conductive elements, e.g., at ambient temperature or without a force applied by force control element.

A second aspect relates to the use of the ferroelectric nanoparticle capacitor-device described above as a multi-logical-level data-storage device.

A third aspect relates to a method for operating a ferroelectric nanoparticle capacitor-device. The ferroelectric nanoparticle capacitor-device comprises a pair of conductive elements electrically insulated from each other, and ferroelectric nanoparticles arranged between the conductive elements of the pair. The ferroelectric nanoparticles are adapted to provide at least three polarization states with different total ferroelectric polarizations, comprising a minimum-ferroelectric-polarization state, a maximum-ferroelectric-polarization state, and at least one intermediate-ferroelectric-polarization state. The method comprises selecting an intermediate-ferroelectric-polarization state; selecting a first voltage or charge according to the selected intermediate-ferroelectric-polarization state; and applying the first voltage or charge to a conductive element of the pair to set the ferroelectric nanoparticles to the selected intermediate-ferroelectric-polarization state.

The method may implement a multi-value logic. The method may further comprise keeping the other conductive element of the pair (i.e., the first conductive element) at a constant electrical charge. Preferably, the first voltage or charge refers to a charge. In other words, the method may refer to selecting a first charge according to the selected intermediate-ferroelectric-polarization state; and applying the first charge.

The selecting the intermediate-ferroelectric-polarization state may refer to selecting an intermediate-ferroelectric-polarization state of the at least one intermediate-ferroelectric-polarization state.

The maximum-ferroelectric-polarization state may provide a maximum ferroelectric polarization of the at least three polarization states. In other words, no polarization state of the at least three polarization states may have a ferroelectric polarization larger than the maximum-ferroelectric-polarization state.

The minimum-ferroelectric-polarization state may provide a minimum ferroelectric polarization of the at least three polarization states. In other words, no polarization state of the at least three polarization states may have a ferroelectric polarization smaller than the maximum-ferroelectric-polarization state.

A ferroelectric polarization of the intermediate-ferroelectric-polarization state may be larger than the minimum ferroelectric polarization and smaller than the maximum ferroelectric polarization.

In the context of this disclosure, a magnitude of a ferroelectric polarization may be determined by a component of the respective ferroelectric polarization along a reference axis. In other words, a negative (e.g., with respect to a reference axis) ferroelectric polarization may be considered smaller than a ferroelectric polarization of zero. The reference axis may intersect the conductive elements and at least one of the ferroelectric nanoparticles.

The conductive element of the pair that the first voltage or charge is applied to may correspond to the second conductive element of the pair described above in the context of the ferroelectric nanoparticle capacitor-device. The other conductive element of the method may correspond to the first conductive element of the pair described above in the context of the ferroelectric nanoparticle capacitor-device.

The ferroelectric nanoparticle capacitor-device may further comprise an additional conductive element electrically insulated from the pair of conductive elements. The applying the first voltage or charge to the conductive element of the pair (i.e., to the second conductive element) may comprise applying a voltage between the additional conductive element and the conductive element of the pair (i.e., the second conductive element). The additional conductive element may be comprised in a charge control device of the ferroelectric nanoparticle capacitor-device.

The method may further comprise, prior to applying the first voltage or charge to set the ferroelectric nanoparticles to the selected intermediate-ferroelectric-polarization state: Providing the ferroelectric nanoparticles in a first polarization state of the at least three polarization states; selecting a second voltage or charge according to the selected intermediate-ferroelectric-polarization state and/or according to the first polarization state; and applying the second voltage or charge to the conductive element of the pair to set the ferroelectric nanoparticles from the first polarization state to a second polarization state of the at least three polarization states. The first polarization state may be different from the selected intermediate-ferroelectric-polarization state. The second polarization state may be different from both the first polarization state and the selected intermediate-ferroelectric-polarization state.

In terms of their respective absolute values, the second voltage or charge may exceed the first voltage or charge.

A sign of the second voltage or charge may be opposite to a sign of the first voltage or charge.

The method may further comprise, prior to applying the second voltage or charge to set the ferroelectric nanoparticles to the selected intermediate-ferroelectric-polarization state: Providing the ferroelectric nanoparticles in a third polarization state of the at least three polarization states; selecting a third voltage or charge according to the selected intermediate-ferroelectric-polarization state and/or according to the first polarization state; and applying the third voltage or charge to the conductive element of the pair to set the ferroelectric nanoparticles from the first polarization state to a third polarization state of the at least three polarization states. The third polarization state may be different from the first polarization state, the second polarization state, and from the selected intermediate-ferroelectric-polarization state.

In terms of their respective absolute values, the third voltage or charge may exceed the second voltage or charge.

A sign of the third voltage or charge may be opposite to a sign of the second voltage or charge.

The selected intermediate-ferroelectric-polarization state may be a remanent state. Alternatively, or in addition, the method may comprise reducing the voltage or charge applied to the conductive element, and thereby preserving the set intermediate-ferroelectric-polarization state; in particular reducing the voltage by at least 30%, by at least a factor of 2, by at least a factor of 3, by at least a factor of 5, by at least a factor of 10, or by at least a factor of 100.

The method may further comprise heating the ferroelectric nanoparticles and/or applying a mechanical force to the ferroelectric nanoparticles, such as to change their polarization state and/or to modify a relationship between the selected intermediate-ferroelectric-polarization state and the applied voltage or charge.

The method may comprise heating the ferroelectric nanoparticles to change their polarization state to a polarization state with a ferroelectric polarization of zero.

The method may further comprise detecting a current polarization state of the ferroelectric nanoparticles based on a voltage of at least one of the conductive elements.

The method may comprise detecting the current polarization state of the ferroelectric nanoparticles based on a change of the voltage of at least one of the conductive elements, such as by counting jumps of the voltage of at least one of the conductive elements.

The first polarization state and/or the second polarization state may be a remanent state.

BRIEF DESCRIPTION OF THE SEVERAL VIEWS OF THE DRAWING(S)

Figure 2A:
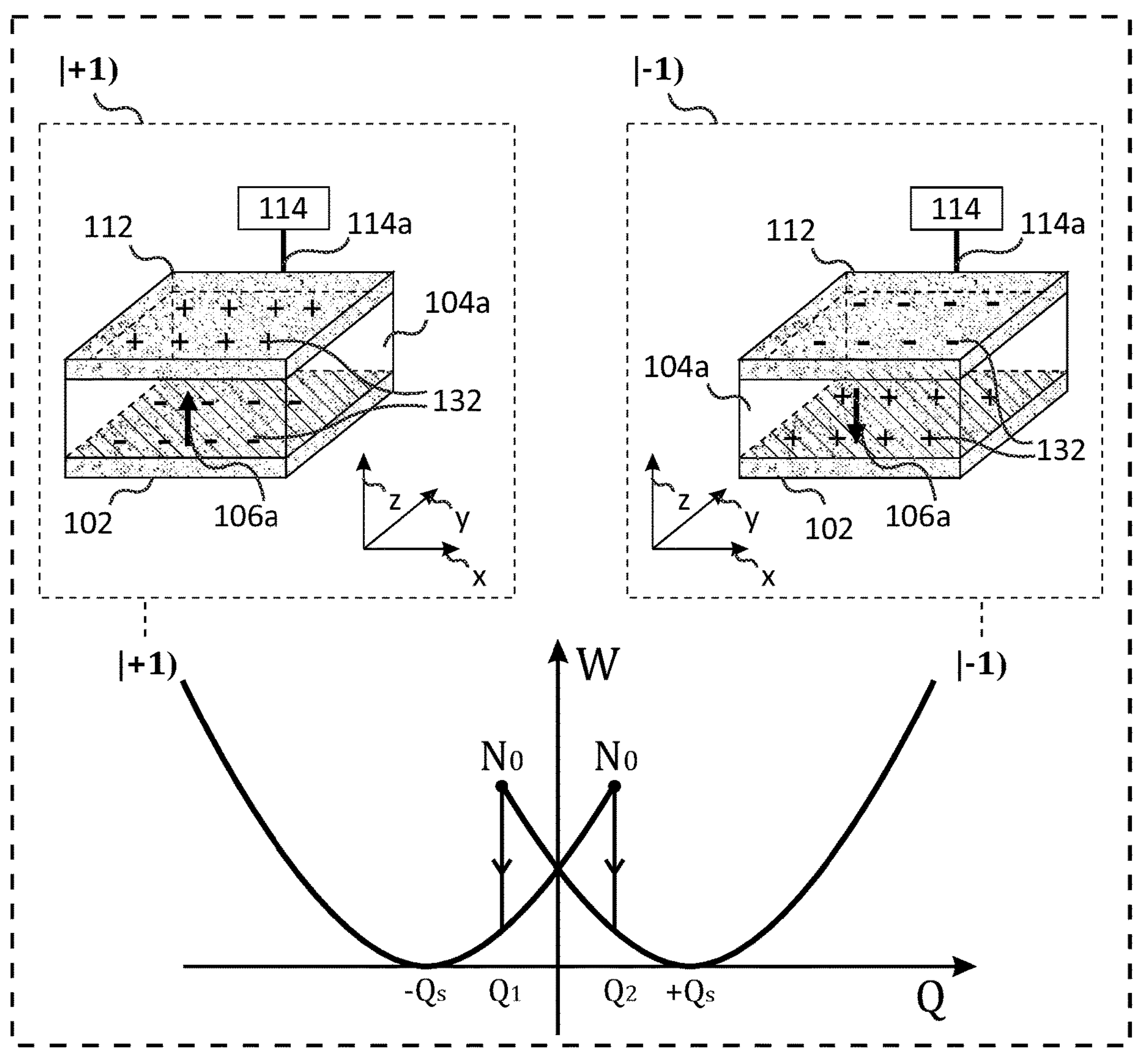
Figure 2B:
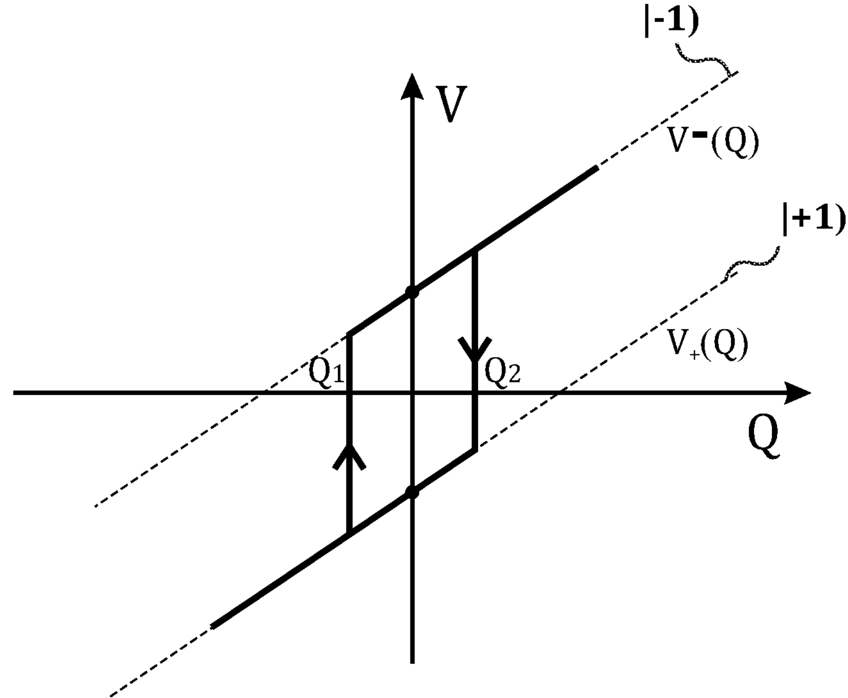

The techniques of the present disclosure and the advantages associated therewith will be best apparent from a description of exemplary embodiments in accordance with the accompanying drawings, in which:

FIG. 1 illustrates the ferroelectric nanoparticle capacitor-device according to first embodiments;

FIG. 2*a* illustrates electrostatic energies of individual polarization states of a ferroelectric nanoparticle between conductive elements, and a switching between them;

FIG. 2*b* illustrates a charge-voltage hysteresis loop demonstrating the switching between the individual polarization states of the ferroelectric nanoparticle of FIG. 2*a;*

Figure 3:
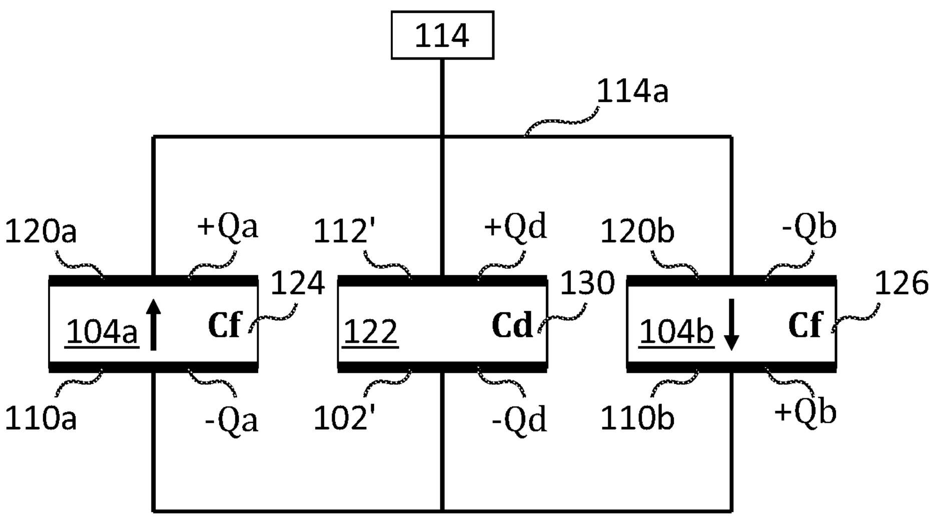
Figure 4A:
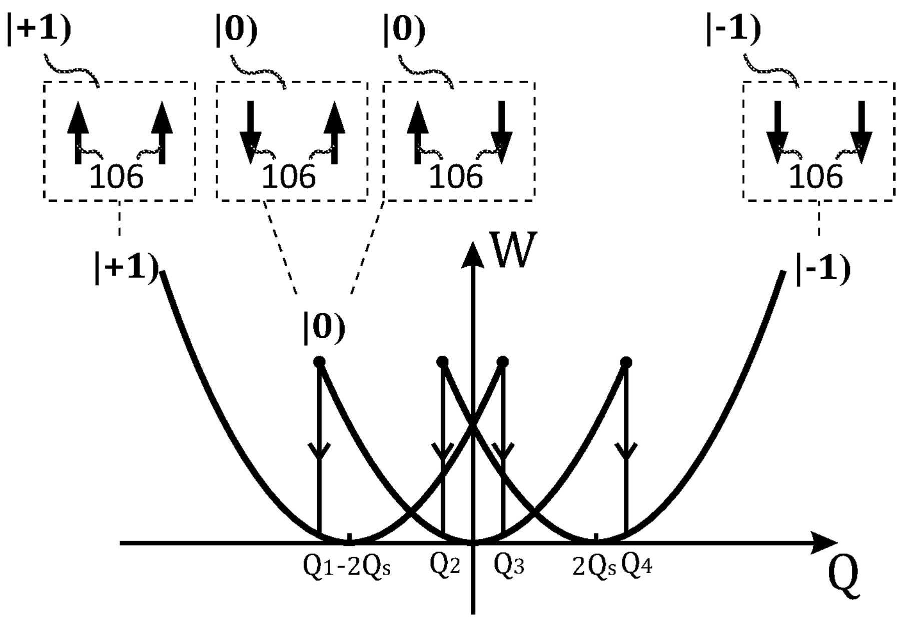
Figure 4B:
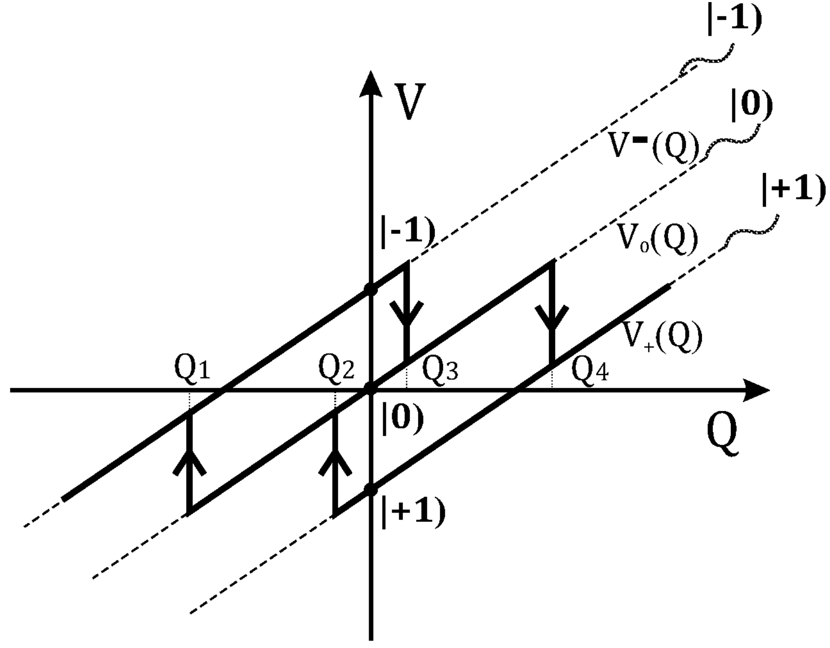
Figure 5A:
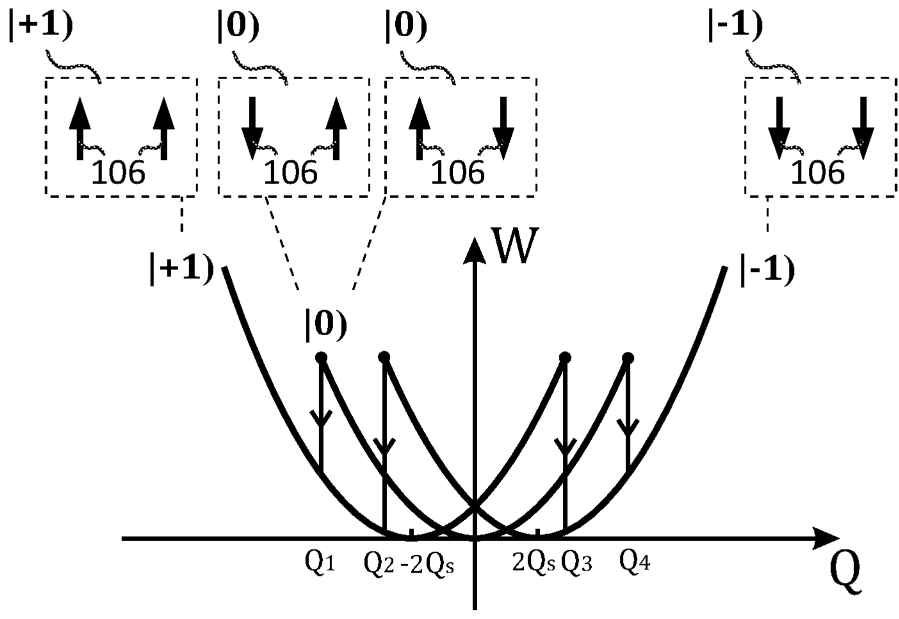
Figure 5B:
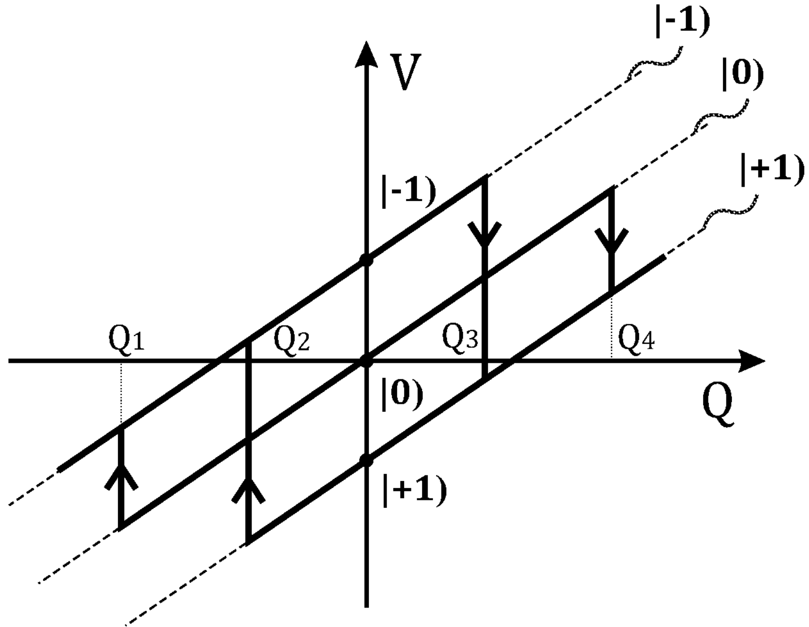
Figure 6A:
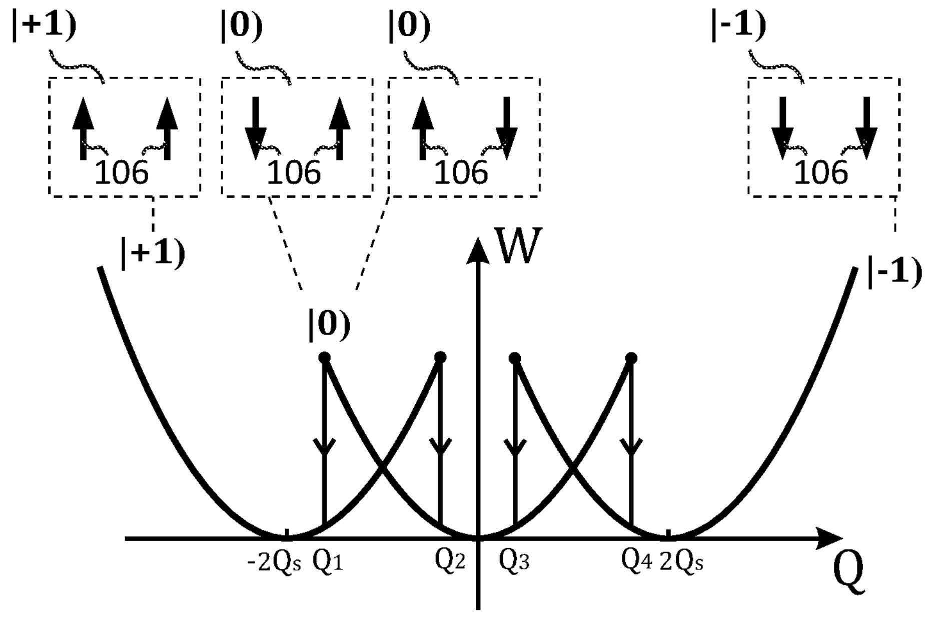
Figure 6B:
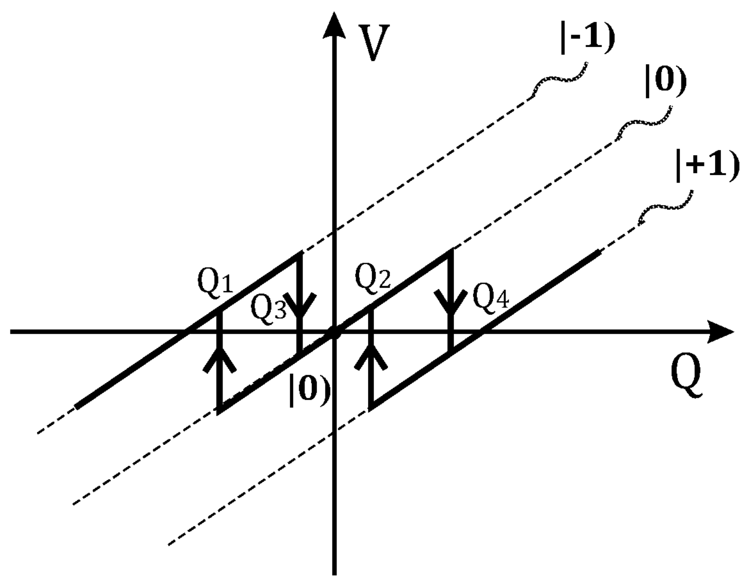
Figure 7A:
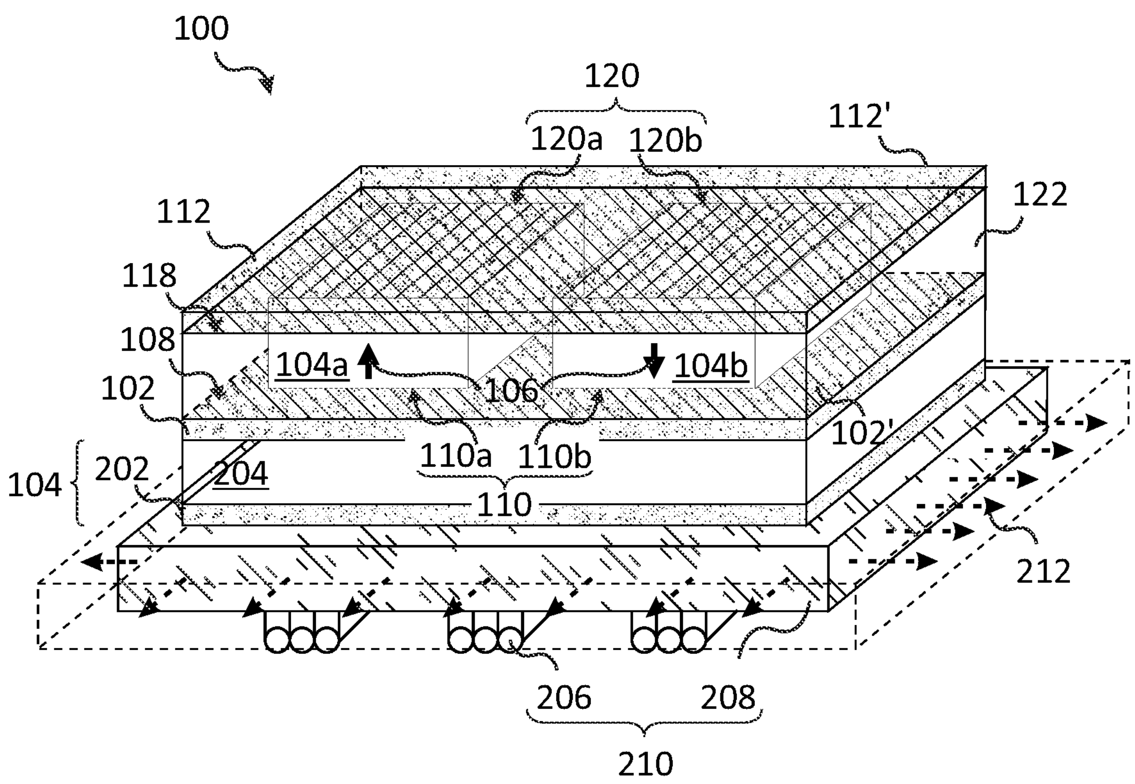
Figure 7B:
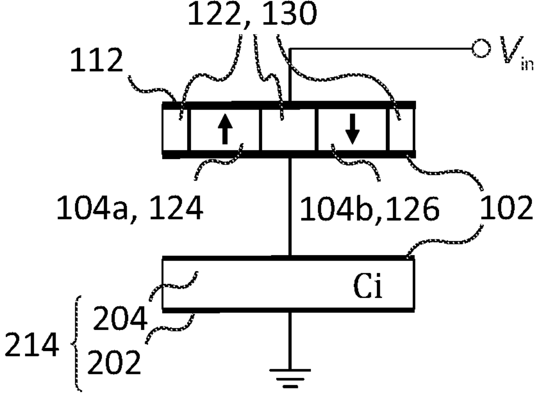

FIG. 3 illustrates an equivalent electric circuit of the ferroelectric nanoparticle capacitor-device of FIG. 1 connected to a charge control device;

FIG. 4*a* illustrates electrostatic energies of the polarization states of the ferroelectric nanoparticle capacitor-device according to an embodiment corresponding to FIG. 1, and routes for addressing and/or switching the polarization states;

FIG. 4*b* illustrates a charge-voltage hysteresis loop associated with the polarization states of the ferroelectric nanoparticles according to the embodiment of FIG. 4*a*, and routes for addressing and/or switching the polarization states;

FIG. 5*a* illustrates electrostatic energies of the polarization states of the ferroelectric nanoparticle capacitor-device according to another embodiment corresponding to FIG. 1, and routes for addressing and/or switching the polarization states;

FIG. 5*b* illustrates a charge-voltage hysteresis loop associated with the polarization states of the ferroelectric nanoparticles according to the embodiment of FIG. 5*a*, and routes for addressing and/or switching the polarization states;

FIG. 6*a* illustrates electrostatic energies of the polarization states of the ferroelectric nanoparticle capacitor-device according to another embodiment corresponding to FIG. 1, and routes for addressing and/or switching the polarization states;

FIG. 6*b* illustrates a charge-voltage hysteresis loop associated with the polarization states of the ferroelectric nanoparticles according to the embodiment of FIG. 6*a*, and routes for addressing and/or switching the polarization states;

FIG. 7*a* illustrates the ferroelectric nanoparticle capacitor-device according to an embodiment with a temperature-control element and a force-control element;

FIG. 7*b* illustrates an equivalent electric circuit of the ferroelectric nanoparticle capacitor-device of FIG. 7*a;*

Figure 8A:
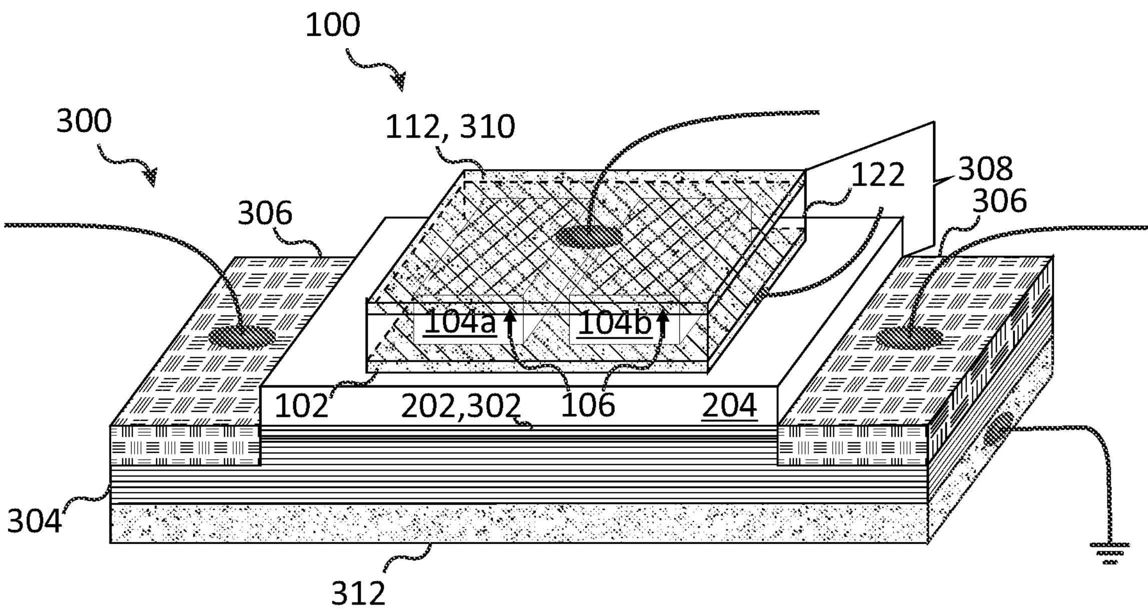
Figure 8B:
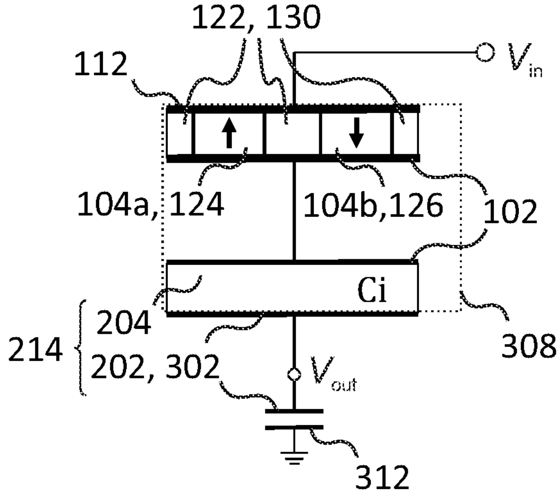

FIG. 8*a* illustrates the ferroelectric nanoparticle capacitor-device according to an embodiment wherein a channel of a transistor forms a conductive element of the ferroelectric nanoparticle capacitor-device;

FIG. 8*b* illustrates an equivalent electric circuit of the ferroelectric nanoparticle capacitor-device of FIG. 8*a;*

FIG. 9*a* illustrates the ferroelectric nanoparticle capacitor-device according to another embodiment, wherein the ferroelectric nanoparticles provide four polarization states;

FIG. 9*b* illustrates the four polarization states of the ferroelectric nanoparticles of FIG. 9*a;*

FIG. 9*c* illustrates the ferroelectric nanoparticle capacitor-device according to another embodiment, wherein the ferroelectric nanoparticles provide four polarization states;

FIG. 9*d* illustrates the four polarization states of the ferroelectric nanoparticles of FIG. 9*c;*

Figure 10A:
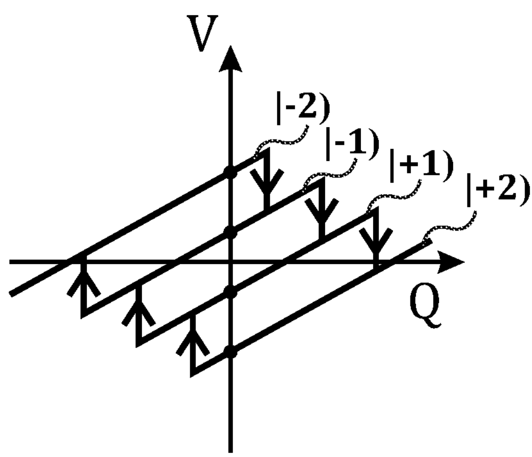
Figure 10B:
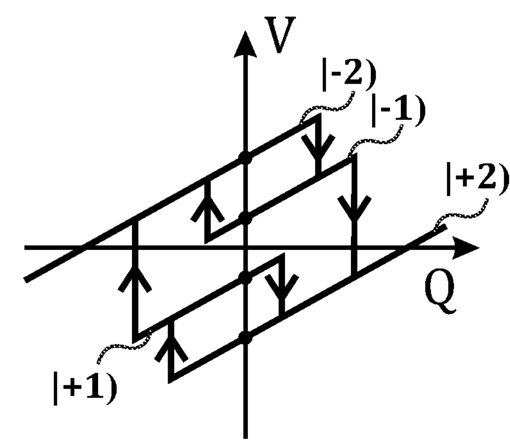
Figure 10C:
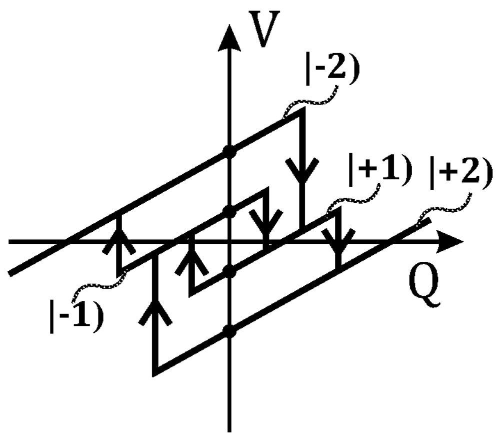
Figure 10D:
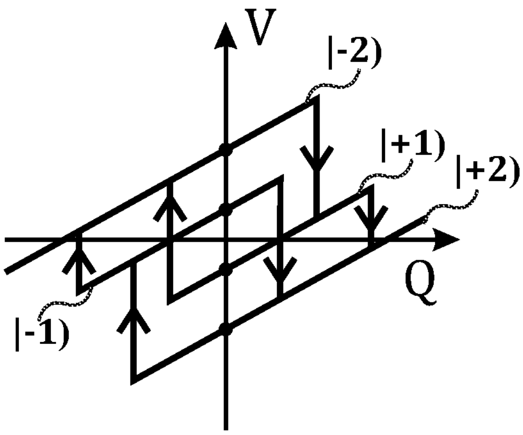
Figure 10E:
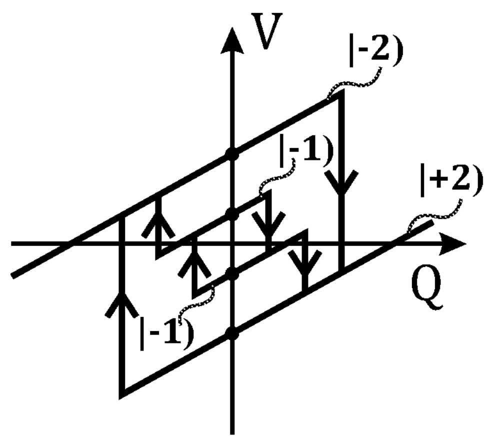
Figure 10F:
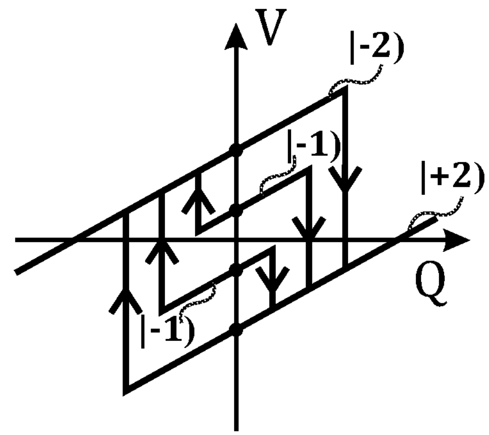
Figure 10G:
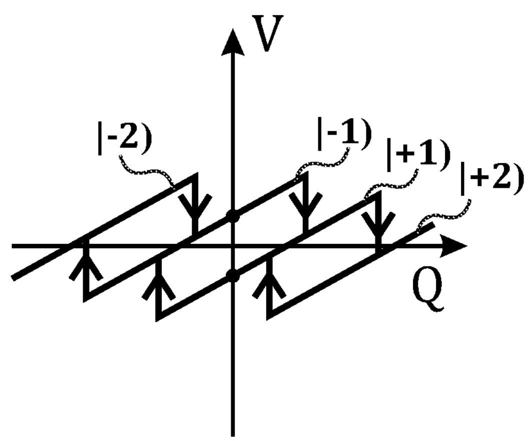
Figure 10H:
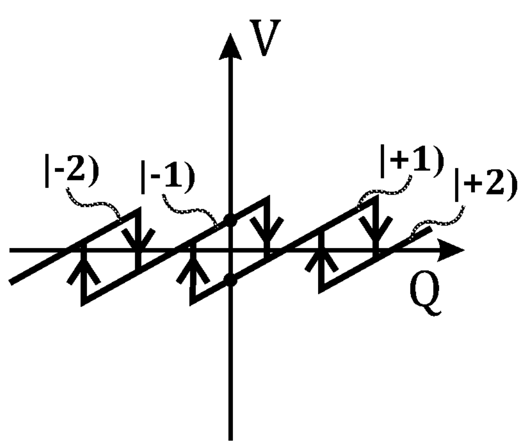
Figure 11:
Figure 11:
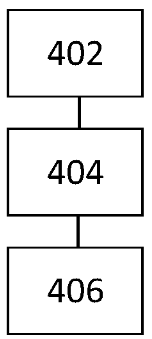

FIG. 10*a* illustrates a charge-voltage hysteresis loop associated with the polarization states of the ferroelectric nanoparticles according to an embodiment corresponding to FIG. 9*a* or FIG. 9*c*, and routes for addressing and/or switching the polarization states;

FIG. 10*b* illustrates a charge-voltage hysteresis loop associated with the polarization states of the ferroelectric nanoparticles according to another embodiment corresponding to FIG. 9*a* or FIG. 9*c*, and routes for addressing and/or switching the respective polarization states;

FIG. 10*c* illustrates a charge-voltage hysteresis loop associated with the polarization states of the ferroelectric nanoparticles according to another embodiment corresponding to FIG. 9*a* or FIG. 9*c*, and routes for addressing and/or switching the respective polarization states;

FIG. 10*d* illustrates a charge-voltage hysteresis loop associated with the polarization states of the ferroelectric nanoparticles according to another embodiment corresponding to FIG. 9*a* or FIG. 9*c*, and routes for addressing and/or switching the respective polarization states;

FIG. 10*e* illustrates a charge-voltage hysteresis loop associated with the polarization states of the ferroelectric nanoparticles according to another embodiment corresponding to FIG. 9*a* or FIG. 9*c*, and routes for addressing and/or switching the respective polarization states;

FIG. 10*f* illustrates a charge-voltage hysteresis loop associated with the polarization states of the ferroelectric nanoparticles according to another embodiment corresponding to FIG. 9*a* or FIG. 9*c*, and routes for addressing and/or switching the respective polarization states;

FIG. 10*g* illustrates a charge-voltage hysteresis loop associated with the polarization states of the ferroelectric nanoparticles according to another embodiment corresponding to FIG. 9*a* or FIG. 9*c*, and routes for addressing and/or switching the respective polarization states;

FIG. 10*h* illustrates a charge-voltage hysteresis loop associated with the polarization states of the ferroelectric nanoparticles according to another embodiment corresponding to FIG. 9*a* or FIG. 9*c*, and routes for addressing and/or switching the respective polarization states; and FIG. 11 illustrates a method according to an embodiment.

DETAILED DESCRIPTION OF THE INVENTION

FIG. 1 is a schematic illustration of a ferroelectric nanoparticle capacitor-device 100 according to a first embodiment. The ferroelectric nanoparticle capacitor-device 100 comprises two conductive elements 102, 112 in the form of conductive layers 102, 112, and ferroelectric nanoparticles 104*a*, 104*b* between them.

The conductive layers 102, 112, or their respective surfaces 108, 118, respectively, each extend along the horizontal, lateral directions x, y, and are thus parallel to each other along those directions x, y.

Along the perpendicular, vertical direction z the conductive layers 102, 112 or their respective surfaces 108, 118, respectively, are spaced apart from each other by a distance d of 1 nm to 100 nm.

The conductive layers comprise a noble metal (such as Cu or Au) as well as tantalum and/or titanium or its respective nitride and/or may comprise other metallic or semiconducting materials.

The ferroelectric nanoparticles 104*a*, 104*b* are composed of respective ferroelectric materials. In the depicted embodiments, the ferroelectric nanoparticles 104*a*, 104*b* are composed of the same ferroelectric material.

The ferroelectric material is a material characterized by the nonlinear dependence of its polarization on the electric field, $P=\pm P_s+\varepsilon_0\varepsilon_f E$, where $\pm P_s$ is the spontaneous polarization, directed parallel or antiparallel to the electric field E respectively, $\varepsilon_0$ is the vacuum permittivity, and $\varepsilon_f$ is the dielectric constant of the ferroelectric material. The switching between the different directions of spontaneous polarization in ferroelectric material occurs at the coercive electric field $E_c$. For the sake of brevity, the coercive electric field is also referred to as the coercive field.

The ferroelectric material of the ferroelectric nanoparticles comprises $Pb(Zr,Ti)O_3$, $PbTiO_3$, or other ferroelectric oxides, $HfO_2$, in particular doped HfO2, comprising, e.g., zirconium, $BaTiO_3$, $Ba(Sr,Ti)O_3$, or other ferroelectric oxides, P(VDF-TrFE. Alternatively, or in addition, it comprises a hyperferroelectric material, LiZnAs, LiBeSb, NaZnSb, LiBeBi. In the hyperferroelectric materials, the coercive field can achieve values substantially larger than the depolarization electric field, which enable an easy selection of the desirable relative strengths of Qc and Qs, for example, while temperature and strain are controlled to tune the system.

Each of the ferroelectric nanoparticles 104a, 104b is sufficiently small to support a monodomain ferroelectric state. For this purpose, the ferroelectric nanoparticles 104a, 104b are formed with their maximum extensions (namely, bulk diagonals) no larger than 100 nm, 50 nm, 30 nm, 20 nm or 10 nm, depending on the ferroelectric material of the ferroelectric nanoparticles 104a, 104b. Typical sizes of the ferroelectric nanoparticles 104a, 104b are 1 nm, 5 nm, 10 nm, 50 nm, or 100 nm.

The depicted ferroelectric nanoparticles 104a, 104b are in one of three possible ferroelectric polarization states 106, in the following also referred to as polarization states 106 for the sake of brevity.

The polarization state 106 refers to the overall polarization state 106 of the ferroelectric nanoparticles 104a, 104b, i.e., to the combination of the individual (i.e., ferroelectric) polarization states of the ferroelectric nanoparticles 104a, 104b.

More specifically, the polarization state 106 refers to the projection of the total (net, overall) polarization of the total (i.e., ferroelectric) polarization of the ferroelectric nanoparticles 104a, 104b onto the axis z. In other words, the polarization state 106 refers to the z-component of the total polarization.

Correspondingly, the individual polarization states refer to the projections of the individual polarizations of the ferroelectric nanoparticles 104a, 104b onto the axis z.

The depicted polarization state 106 is characterized by antiparallel individual polarization states of the ferroelectric nanoparticles 104a, 104b, with the individual polarization of the ferroelectric nanoparticle 104a along (i.e., parallel to) the axis z, and the individual polarization of the ferroelectric nanoparticle 104b antiparallel to the axis z. The same polarization state, i.e., with a same z-component of the total polarization, is realized when the individual polarization of the ferroelectric nanoparticle 104b is along the axis z, and the individual polarization of the ferroelectric nanoparticle 104a is antiparallel to the axis z. In the depicted embodiment, these two configurations are equivalent as the ferroelectric nanoparticles 104a are equivalent, i.e., with the same individual polarizations. The two configurations therefore establish a first one of the polarization states 106.

A second polarization state 106 is realized when the individual polarizations of the ferroelectric nanoparticles 104a, 104b are both along the axis z.

A third polarization state 106 is realized when the individual polarizations of the ferroelectric nanoparticles 104a, 104b are both antiparallel to the axis z.

The ferroelectric nanoparticle 104a is sandwiched between the first-first sections 110a, 120a of the conductive layers 102, 112. Vice versa, the first-first sections 110a, 120a of the conductive layers 102, 112, or of their corresponding surfaces, respectively, correspond to projections of the ferroelectric nanoparticle 104a onto the conductive layers 102, 108.

The first-first sections 110a, 120a of the conductive layers 102, 112 and the ferroelectric nanoparticle 104a form a first ferroelectric capacitor 124.

Correspondingly, second first sections 110b, 120b of the conductive layers 102, 112 are associated with the ferroelectric nanoparticle 104b. The second first sections 110b, 120b of the conductive layers 102, 112 and the ferroelectric nanoparticle 104b form a second ferroelectric capacitor 126.

The first sections 110a, 110b of the first conductive layer 102 have a total area 110 which corresponds to the projection of the ferroelectric nanoparticles 104a, 104b onto the first conductive layer 102, or onto its surface 118, respectively. In the context of this disclosure, this area 110 is referred to as the overall surface-projected area of the ferroelectric nanoparticles 104a, 104b.

The overall surface-projected area 110, 120 of the ferroelectric nanoparticles 104a, 104b is alternatively defined by the projection 120 of the ferroelectric nanoparticles 104a, 104b onto the second conductive layer 112. Alternatively, the surface-projected area 110, 120 of the ferroelectric nanoparticles 104a, 104b is defined by the sum of the areas of the ferroelectric capacitors 124, 126 defined by the ferroelectric nanoparticles 104a, 104b.

The area of each of the conductive layers 102, 122 exceeds the overall surface-projected area 110, 120 of the ferroelectric nanoparticles 104a, 104b. Consequently, excess portions 102', 112' of the conductive layers 102, 122 extend beyond the first sections 110a, 110b, 120a, 110b.

These excess portions 102', 112' form a dielectric capacitor 130, i.e. a capacitor with linear charge-voltage characteristics or without a (significant) hysteresis.

In the depicted embodiment, the dielectric capacitor 130 comprises a dielectric material 122 arranged between second portions 102', 112' of the conductive layers 102, 112. In the depicted embodiment, the dielectric material 122 fills the entire space between the excess portions 102', 112' of the conductive layers 102, 112, such that the second portions 102', 112' are identical to the excess portion 102', 112' of the conductive layers 102, 112.

The dielectric material 122 is characterized by a linear dependence of its polarization on an applied electric field, $P=\varepsilon_0\varepsilon_d E$, where $\varepsilon_d$ is the dielectric constant of the dielectric material 122. According to embodiments, the dielectric material comprises a high-κ dielectric such as $Al_2O_3$, $Li_2O$, $HfSiO_4$, $Sc_2O_3$, SrO, $ZrO_2$, $Y_2O_3$, BaO, $Ta_2O_5$, BaO, $WO_3$, $MoO_3$, $TiO_2$, $SrTiO_3$, $DyScO_3$. A dielectric material 122 may also comprise a low-κ dielectric such as $SiO_2$ or an organic dielectric. In alternative embodiments, the dielectric material 122 is implemented as an air gap, which may be filled with a substitutional gas or vacuum.

In the depicted embodiment, the dielectric material 122 serves as a dielectric separator material 122 to separate the ferroelectric nanoparticles 104a, 104b from one another. For this purpose, the dielectric material 122 is arranged between the ferroelectric nanoparticles 104a, 104b and encircles the ferroelectric nanoparticles 104a, 104b individually in the horizontal/lateral plane x, y.

The ferroelectric nanoparticle capacitor-device 100 is manufactured using existing nano-manufacturing procedures, in particular nano-manufacturing procedures developed in the context of semiconductor industries. These procedures allow to fabricate complex designs with precision and reliability. For example, advances in fabrications enable the creation of three-dimensional design of the ferroelectric nanoparticle capacitor-device 100 on a suitable substrate support. An exemplary single crystal semiconducting substrate of a selected type doping, or conductivity, respectively (for example, n-conductivity) is available commercially from various sources. A proper geometric design is achieved by the appropriate lithography and etching techniques, for example, electron beam lithography and ion etching. The conductive elements 102, 112 are created by CVD and PVD methods and/or other suitable processes. After deposition of a first conductive element 102, 112, a ferroelectric layer is disposed, thereover, using, for example, an ALD approach and/or other suitable processes. The constitutive ferroelectric nanoparticles 104*a*, 104*b* are structured individually or together from the ferroelectric layer, e.g., in a single structuring step. In the former case, the geometric configuration at each stage is designed using appropriate lithography techniques, for example, extreme ultraviolet or electron beam lithography. The dielectric material 122 is optionally grown over the first conductive element 102, 112 by the, for example, ALD technique. A second conductive element 102, 112 is deposited. Optional interconnecting structures are formed on or in the substrate to form gate, source and drain wire connection, for example by CVD and PVD methods. The patterning and architecture of the device 100 is to be implemented by the, for example, Cadence Allegro software package and/or other suitable packages.

To illustrate the working mechanism of the ferroelectric nanoparticle capacitor-device 100, FIG. 2*a*, FIG. 2*b* refer to the situation of a single ferroelectric nanoparticle 104*a* between conductive elements 102, 112, with a charge control device 114 electrically connected 114*a* to one of the conductive elements 102, 112.

As shown in FIG. 2*a*, the ferroelectric nanoparticle 104*a* is uniformly polarized and is confined between the two conductive elements 102, 112 carrying the electric charge 132. It can stay in either of two individual (ferroelectric) polarization states 106*a*: a state (+1), having the polarization directed "up" along the z-axis, and a state (−1) having the polarization directed "down". The single ferroelectric nanoparticle 104*a* between conductive elements 102, 112 thus implements two corresponding logical levels, l+1) and l−1).

Consequently, the individual polarization state 106*a* may be controlled by the charge applied to the conductive elements 102, 112. The single ferroelectric nanoparticle 104*a* of FIG. 2*a*, confined between the conductive elements 102, 112, therefore implements a binary (i.e., two-level) logic device with the logical levels l+1) and mL+1).

Here, and in the following, a charge control device 114 with an electrical connection 114*a* to at least one of the conductive elements 102, 112 is used to control the charge of the respective conductive element(s) 102, 112 and thus the individual polarization state 106*a* of the ferroelectric nanoparticle 104*a* or the polarization state 106 of FIG. 1. This approach is distinct from conventional techniques, which control the voltages at conductive elements. Advantageously, through the charge control and the charge control device 114, the nanoparticle 104*a* or the nanoparticles 104*a*, 104*b* of FIG. 1 and their respective polarization states 106*a*, 106 are addressed much more reliably than in conventional techniques based on the voltage control.

Importantly, the effective electric field, E, operating the polarization of the ferroelectric nanoparticle 104*a* includes not only the field induced by the charge 132 on the conductive plates, but also by the depolarization field, induced by the bound charge, $Q_s=SP_s$, emerging at the polarization field lines' termination points located at the interface between the ferroelectric nanoparticle 104*a* and the conductive elements 102, 112. Herein, $P_s$ refers to the spontaneous polarization of the ferroelectric nanoparticle associated with the polarization state 106*a*. The voltage-charge relation for the single ferroelectric nanoparticle capacitor is given by $C_fV=Q\pm Q_s$, where V is the voltage and $C_f=\varepsilon_0\varepsilon_fS/d$ is the capacitance of the ferroelectric material and the sign ± corresponds to the "up" (+1) or "down" (−1) orientation of the polarization 106*a*.

FIG. 2*b* exemplifies the electrostatic energies, $W_\pm=(Q\pm Q_s)_2/2C_f$ corresponding to the (+1) and (−1) polarization states 106*a* of FIG. 2*a*, as functions of the applied charge Q. They are shifted over ±Q, with respect to Q=0, and the minima correspond to situations where the charge on the conductive elements 102, 112 precisely compensates the bound charge resulting in the zero internal field. The terminal points $N_0$ (corresponding to the critical charges $Q_{1,2}$) of parabolas correspond to the situation where a polarization states 106*a* with a given polarization direction becomes unstable with respect to switching to the polarization states 106*a* with the opposite polarization direction. The critical charges $N_0$ corresponding to the switching (−1)→(+1) and (+1)→(−1) are given by $Q_{1,2}=\pm(Q_s-Q_c)$ respectively, where $Q_c=C_fE_cd$. This energy profile results in the charge-voltage two-branch switching hysteresis loop V(Q) with upper and lower branches $$V\pm(Q)=C_f^{-1}(Q\pm Q_s)$$

corresponding to the polarization states 106*a*, or logical levels l+1) and l−1), respectively.

FIG. 3 shows an effective electric circuit of the ferroelectric nanoparticle capacitor-device 100 of FIG. 1. The ferroelectric nanoparticle capacitor-device 100 includes the two ferroelectric capacitors 124, 126, each with a capacitance Cf. It further comprises a dielectric capacitor 130 with a capacitance Cd, connected in parallel to the ferroelectric capacitors 124, 126.

The effective electric circuit further comprises a charge-control element 114 in electrical contact 114*a* with at least one of the conductive elements 102, 112. The charge-control element 114 is adapted to apply a charge Q to the conductive element(s) 102, 112 it is connected to.

Importantly, the charge Q applied to the conductive elements 102, 112 can be distributed nonuniformly over the conductive elements 102, 112, forming the charge $Q_a$ in the region of the first ferroelectric nanoparticle 104*a* (or on first sections 110*a*, 120*a* of the conductive elements 102, 112 corresponding to the first ferroelectric capacitor 124, respectively), the charge $Q_b$ in the region of the second ferroelectric nanoparticle 104*b* (or on sections 110*b*, 120*b* of the conductive elements 102, 112 corresponding to the second ferroelectric capacitor 126, respectively), and the charge $Q_d$ in the region of the dielectric material 130 (or on the second portions or the excess portions 102', 112' of the conductive layers 102, 112, respectively, corresponding to the dielectric capacitor 130).

The charges $Q_a$, $Q_b$, and $Q_d$ of the corresponding capacitors 124, 126, 130 are determined by the equality of the potential at the plates of the capacitors and are determined by the condition:

$$C_f^{-1}(Q_a\pm Q_s)=C_f^{-1}(Q_b\pm Q_s)=C_d^{-1}Q_d,$$

taking into account that $Q_a+Q_b+Q_d=Q$. Here every particular combination of pluses and minuses corresponds to a polarization state 106 of the system, $C_f=\varepsilon_0\varepsilon_fS_f/d$ is the capacitance of the ferroelectric material and $C_d=\varepsilon_0\varepsilon_d(S-2S_f)/d$ is the capacitance of the dielectric spacer. From the above condition, one obtains $$Q_{a,b}=(C_f/C_{eff})Q\pm Q_s,\ Q_d=(C_d/C_{eff})Q,\text{ where } C_{eff}^{-1}=2C_f^{-1}+C_d^{-1}$$

is the effective capacitance of the entire system.

FIG. 4*a* illustrates the emerging polarization states 106 and their total energies W.

In the following, the term "level" refers to a logical level, the two terms are used equivalently.

The levels are represented by the polarization states 106 of the ferroelectric nanoparticles 104*a*, 104*b*, and vice versa. In other words, the polarization states 106 provide the levels. For this reason, the terms "level" and "polarization states" may be used equivalently.

The polarization states 106 are preferentially discrete polarization states 106, e.g., in a sense that a switching between two different polarization states 106 is characterized by a subtle, abrupt change of the ferroelectric polarization. In other words, the ferroelectric nanoparticles 104*a*, 104*b* are adapted to not assume any stable ferroelectric polarization between the one of the discrete polarization states 106.

The polarization states 106 are determined by minimization of the total energy $$W=Q_a^2/2C_f+Q_b^2/2C_f+Q_d^2/2C_d,$$

that gives the energies corresponding to either of three above states 106 defining logic levels, |−1), |0), and |+1). Namely, $W_{-1}=(Q-2Q_s)^2/2C_{eff}$, $W_0=Q^2/2C_{eff}$, and $W_{+1}=(Q+2Q_s)^2/2C_{eff}$. The switching between the logical levels takes place when the field inside the corresponding ferroelectric nanoparticle 104*a*, 104*b* exceeds the coercive field Ec. It occurs at four distinct values of the total charge of the capacitor $Q_{1,4}=\pm Q_c$ for level |0), $Q_2=2Q_s-Q_c$ for level |−1), and $Q_3=-2Q_s+Q_c$ for level |+1), where $Q_c=C_{eff}E_c d$.

FIG. 4*a*, FIG. 5*a*, and FIG. 6*a* present the abovementioned energy profiles, $W_{+1}(Q)$, $W_0(Q)$, $W_{-1}(Q)$ for the polarization states 106, |−1), |0), and |+1). FIG. 4*b*, FIG. 5*b*, and FIG. 6*b* present corresponding three-branch hysteresis loops, and routes for addressing the polarization states 106, |−1), |0), and |+1), or switching between them, respectively. The polarization states 106, |−1), |0), and |+1) are associated with three branches of the charge-voltage characteristics $$V_-(Q)=C_{eff}^{-1}(Q-2Q_s),\ V_0(Q)=C_{eff}^{-1}Q \text{ and } V_+(Q)=C_{eff}^{-1}(Q+2Q_s).$$

FIG. 4*a*, FIG. 4*b*, FIG. 5*a*, FIG. 5*b*, FIG. 6*a*, and FIG. 6*b* represent the three existing distinct regimes of topology of the hysteresis loops, determined by the relative strength of the effective charge parameters $Q_c$ and $Q_s$.

The energy profile of polarization states 106, |−1), |0), and |+1) and transition sequence are exemplified in FIG. 4*a*, FIG. 4*b* for the case $3Q_s>Q_c>2Q_s$. The terminal points, $N_0$, correspond to the switching instability of one of the ferroelectric nanoparticles 104*a*, 104*b* towards the lowest-energy state with the opposite polarization 106. The corresponding hysteresis loop with sequential switching between the logical levels |−1), |0), and |+1) at the said critical charges $Q_1$, $Q_2$, $Q_3$, and $Q_4$ is demonstrated in FIG. 4*b*.

FIG. 5*a*, FIG. 5*b* present the energy profile and charge-voltage characteristics realized under the condition $Q_c>3Q_s$. Although it has three logic levels |−1), |0), and |+1) realized at Q=0, the intermediate-ferroelectric-polarization state, |0), is topologically unstable in a sense that once the switching from this logical level to either |−1) or |+1) has occurred, the system can never be switched back to the |0) logical level, and a two-branch hysteresis loop with switching between the minimum-ferroelectric-polarization state |−1) and the maximum-ferroelectric-polarization state |+1) becomes the only effective regime. The switching of the system to the "hidden" logical level, |0), can be achieved, however, by variation of external parameters, different from the charge, for instance by thermal cycling, involving passing through a high temperature paraelectric state.

FIG. 6*a* and FIG. 6*b* present the energy profiles and charge-voltage characteristics realized under the condition $Q_c<2Q_s$. There is only one logic level, |0), at zero charge, but hysteretic switching occurs at finite charges, implementing, thus, a three-position relay element, also known as the Schmitt trigger.

Importantly, the hysteresis loops shown in FIG. 4*b* (FIG. 4*a*), FIG. 5*b* (FIG. 5*a*) and FIG. 6*b* (FIG. 6*a*) realize all the topologically possible sets of switching in the 3-levels logic [Baudry, L., Lukyanchuk, I., and Vinokur, V. Sci. Rep. 7, 42196 (2017)]. In our embodiment, it is the relation of the material-depended critical parameters, Qs and Qc that determine which type of the logic is realized. The specific switching properties/protocols can be achieved by the selection of the desirable ratio between parameters, Qs and Qc, or by appropriately selecting the size and material composition of the ferroelectric nanoparticles 104*a*, 104*b*, respectively.

FIG. 7*a* presents an embodiment of a ferroelectric nanoparticle capacitor-device 100 similar to the one of FIG. 1, alternatively implementing the hysteresis loops shown in FIG. 4*b* (FIG. 4*a*), FIG. 5*b* (FIG. 5*a*) and FIG. 6*b* (FIG. 6*a*).

As compared to FIG. 1, the ferroelectric nanoparticle capacitor-device 100 of FIG. 7*a* is formed with various modifications: It comprises a charge control device 104, consisting of an additional conductive element 202 and a dielectric spacer 204. In addition, the ferroelectric nanoparticle capacitor-device 100 of FIG. 7*a* comprises a temperature-control element 206. It also comprises a force-control element 210. According to various embodiments (not shown), the ferroelectric nanoparticle capacitor-device 100 is formed with any, any combination, or all of the described modifications (charge control device 104 and/or temperature-control element 206 and/or force-control element 210).

The charge control device 104 comprises an additional conductive element 202 arranged below the first conductive element 102, opposite to the second conductive element 112 which is arranged above the first conductive element 102.

The charge control device 104 further comprises a dielectric spacer 204, formed as a layer 204 of dielectric material between the first conductive element 102 and the additional conductive element 202 to electrically insulate them from each other. The dielectric spacer 204 is composed of one of the dielectric materials described above, and preferentially contains SrTiO3, SiO2, Si3N4, or HfO2.

The charge control device 104 is operated by applying a voltage between the additional conductive element 202 and the second conductive element 112 while the first conductive element 102 is kept at a fixed charge (e.g., electrically floating), resulting in the application of a charge to the second conductive element 112.

The temperature-control element 206 is implemented as a heater 206, more specifically as an Ohmic heater 206. The heater 206 is arranged below a conductive element 102, 112, to heat the respective conductive element 102, 112 and thus the ferroelectric nanoparticles 104*a*, 104*b*. A temperature variation of the ferroelectric nanoparticles 104*a*, 104*b* can be of the range 10-300 Kelvin.

The ferroelectric nanoparticle capacitor-device 100 of FIG. 7*a* further comprises a substrate 208 to support the ferroelectric nanoparticle capacitor-device 100.

The substrate is arranged below the conductive elements 102, 112, and below the additional conductive element 202 if present. The substrate is in thermal contact with one of the (first, second, or additional) conductive elements 102, 112, 202; e.g. via a direct physical contact or an indirect contact via a heat-conducting material such as a metal or a sufficiently thin (<100 nm or <20 nm) intermediate layer.

Heating the substrate 208 using the heater 223 leads to a mechanical deformation 212 in the form of an expansion 212, that generates strains in the ferroelectric nanoparticles 104*a*, 104*b*. Alternatively, the strain can also be induced by the piezoelectric effect developing when the electric field is applied to the substrate 208. For example, the generated strain can lie in the range of 0.001-0.1% of the crystal lattice constant.

The temperature-control element 206 and/or the force-control element 210 permit to tune the interrelation between the parameters Qs and Qc by the external stimuli temperature and/or strain. They thus allow for an on-the-fly modification of the switching logic of the said device 100. This tuning can be done by accounting for different temperature and strain dependences of these parameters. The so-called hyper-electric materials, for example, LiZnAs, LiBeSb, NaZnSb, and LiBeBi, present the particular interest for implementation of the ferroelectric nanoparticles 104*a*, 104*b*, because in these materials the coercive field can achieve values substantially larger than the depolarization electric field, and the relative strengths of the parameters, Qs and Qc can vary over fairly wide ranges.

FIG. 7*b* shows an equivalent electric circuit of the ferroelectric nanoparticle capacitor-device 100 of FIG. 7*a*. The additional conductive element 202 and the dielectric spacer 204 form an additional capacitor 214 with the capacitance Ci. The additional capacitor 214 shares the first conductive element 102 with the capacitors 124, 126, 130. The equivalent electric circuit therefore comprises the capacitors 124, 126, 130 (defined by the conductive elements 102, 112) and the additional capacitor 214 (defined by the conductive elements 102, 202) connected in series. The second conductive element 112 and the additional conductive element 202 receive the incoming voltage Vin between them. The charge at the conductive elements 102, 112 induced by the voltage Vin is given by the equation $Vin=Q/Ci+V(Q)$, where V(Q) is the voltage determined by the charge—voltage characteristics such as exemplified in FIG. 4*b*, FIG. 5*b*, FIG. 6*b*. This relation becomes particularly simple and transforms to $Q \approx Ci\ Vin$ when the effective capacitance of the parallel arrangement of the capacitors 124, 126, 130 substantially exceeds the capacitance of the additional capacitor 214. The charge that controls the polarization state 106 of the ferroelectric nanoparticles 104*a*, 104*b* is directly tuned by the voltage Vin applied to the second conductive element 112 and the additional conductive element 202.

FIG. 8*a* illustrates the integration of the ferroelectric nanoparticle capacitor-device 100 into a field-effect transistor 300, alternatively implementing the hysteresis loops shown in FIG. 4*b* (FIG. 4*a*), FIG. 5*b* (FIG. 5*a*) and FIG. 6*b* (FIG. 6*a*). FIG. 8*b* shows an equivalent electric circuit of the device 100 of FIG. 8*a*.

The field-effect transistor 300 comprises source/drain regions 304, 306, a channel 302 extending between the source/drain regions 304, 306, and a gate stack 308 arranged over the channel 302. The field-effect transistor 300 further comprises a body electrode 312, which is grounded.

The channel 302 serves as the additional conductive element 202 described in the context of FIG. 8*a*.

The gate dielectric 204 is a high-k dielectric layer, preventing a charge leakage between the first conductive element 102 and the channel 302.

The gate stack comprises the gate dielectric 204, provided by the dielectric spacer 204, and at least one electrode. In the depicted embodiment, the at least one electrode of the gate stack 308 is provided by a ferroelectric nanoparticle capacitor-device 100 similar to the one of FIG. 1. More specifically, the second conductive element 112 of the ferroelectric nanoparticle capacitor-device 100 serves as a gate electrode of the transistor 300 and is connected to an external voltage source to receive the driving voltage $V_{in}$. Preferably, the driving voltage $V_{in}$ is applied between the second conductive element 112 and the additional conductive element (channel) 202, 302, implementing the charge control device 114 described above in the context of FIG. 7*a*.

As described above in the context of previous embodiments, the first conductive element 102 is kept at a constant charge, e.g., kept electrically isolated and floating. It thus serves to stabilize the polarization 106 of the ferroelectric nanoparticles 104*a*, 104*b*. Furthermore, the floating first conductive element 102 makes the potential along the interface between the ferroelectric nanoparticles 104*a*, 104*b* and the first conductive element 102 even, maintaining, therefore, a uniform electric field across the gate stack 308 and the substrate 304.

The stepwise switching of the voltage, Vout, operating the current in the channel 302, under the appropriate protocol for the variation of the driving voltage Vi, realizes the multilevel logic switching sequence corresponding to the one of the topologically possible hysteresis loops (see FIG. 4*a* to FIG. 6*b*). The logic levels switching order can be modified by the external stimuli, for example, by the temperature or strain, as described above in the context of FIG. 7*a*, FIG. 7*b*, allowing for the on-fly modification of the switching logics of the ferroelectric nanoparticle capacitor-device 100.

According to different embodiments, the ferroelectric nanoparticle capacitor-device 100 is formed with the temperature-control element 206 and/or the force-control element 210 described above in the context of FIG. 7*a*, e.g., instead of the substrate 312, integrated into the substrate 312 or below the substrate 312. In the latter embodiments, a substrate 312 with a high heat conductivity is applied.

FIG. 9*a*, FIG. 9*c* present embodiments of the ferroelectric nanoparticle capacitor-device 100 for implementing a topologically configurable 4-level logical unit. FIG. 9*b*, FIG. 9*d* show the respective polarization states 106 representing the 4 logical levels.

FIG. 9*a* shows a ferroelectric nanoparticle capacitor-device 100 with three identical, for example, cylindrical ferroelectric nanoparticles 104*a*, 104*b*, 104*c* between the conductive elements 102, 112. The ferroelectric nanoparticles 104*a*, 104*b*, 104*c* provide equal coercive fields and equal cross-sections.

In the depicted embodiment, a dielectric separator material 122 fills the residual space between the conductive elements 102, 114.

The system is driven and controlled by an electric charge, Q, placed onto at least one of the conductive elements 102, 114, using a charge control element 114 as described above.

As illustrated in FIG. 9*b*, the ferroelectric nanoparticle capacitor-device 100 of FIG. 9*a* provides the polarization states, (+++), (++−) (or equivalently, (+−+) and (−++)), (+−−), or equivalently, (−+−) and (−−+), and, finally, (−−−), wherein arrows down (or up) in FIG. 9*b* represent negative "−" or positive "+" polarization with respect to the z axis.

Consequently, the ferroelectric nanoparticle capacitor-device 100 of FIG. 9*a* realizes a 4-level logic, characterized by the logic levels l+2), l+1), l−1), and l−2), respectively.

FIG. 9*c* shows another embodiment of a ferroelectric nanoparticle capacitor-device 100 for implementing a 4-level logic device. Here, two non-equivalent ferroelectric nanoparticles 104*a*, 104*b* are disposed between the conductive elements 102, 112 and coated by a dielectric separator material 122. The ferroelectric nanoparticles 104*a*, 104*b* can be made from different ferroelectric materials and may have different sizes.

FIG. 9*d* illustrates the polarization states 106 of the ferroelectric nanoparticles 104*a*, 104*b* of FIG. 9*c*, which are similar to the polarization states 106 of FIG. 4*a* associated with the ferroelectric nanoparticles 104*a*, 104*b*, 104*c* of FIG. 1. However, in FIG. 9*d*, since the states (+−) and (−+) are not equivalent, the four polarization states 106 implement the logical levels of a 4-level logic unit, namely, (−−)↔l−2), (−+)↔l−1), (+−)↔l+1), and (++)↔l+2).

Except for the number or the size/material composition of the ferroelectric nanoparticles 104*a*, 104*b*, 104*c*, the embodiments of FIG. 9*a*, FIG. 9*c* are similar to the embodiment of FIG. 1. In alternative embodiments (not depicted), the ferroelectric nanoparticles 104*a*, 104*b*, 104*c* described in the context of FIG. 9*a* or FIG. 9*c* (i.e., with the respective number or with the respective size/material composition) are applied in a ferroelectric nanoparticle capacitor-device 100 similar to the embodiment of FIG. 7*a* or FIG. 8*a*.

FIG. 10*a*, FIG. 10*b*, FIG. 10*c*, FIG. 10*d*, FIG. 10*e*, FIG. 10*f*, FIG. 10*g*, and FIG. 10*h* illustrate charge-voltage hysteresis loops associated with the polarization states 106 of ferroelectric nanoparticle capacitor-devices 100 similar to the ones of FIG. 9*a* or FIG. 9*c*.

Considerations similar to those given above for the 3-level logic units, show that the hysteresis loops V(Q) for the said 4-level configurations of the ferroelectric nanoparticles 104*a*, 104*b* have four branches corresponding to the logical levels 116, l+2), l+1), l−1), and l−2). FIG. 10*a*, FIG. 10*b*, FIG. 10*c*, FIG. 10*d*, FIG. 10*e*, FIG. 10*f*, FIG. 10*g*, and FIG. 10*h* present all possible hysteresis loops with different switching sequences in 4-level logic [Baudry, L., Lukyanchuk, I., and Vinokur, V. Sci. Rep. 7, 42196 (2017)].

FIG. 10*a* shows a charge-voltage hysteresis loop with the sequential switching between the logical levels/polarization states 106, l+2), l+1), l−1), and l−2), driven by changing the charge Q at the conductive elements 102, 112.

The charge-voltage hysteresis loops in FIG. 10*a*, FIG. 10*b*, FIG. 10*c*, and FIG. 10*d* correspond to different switching sequences between logical levels/polarization states 106, 1+2), l+1), l−1), and l−2) that can be used or the design of the four-level logic memories or other processing protocols with different topological ways of accessing the information stored at these logical levels/polarization states 106, l+2), l+1), l−1), and l−2).

The charge-voltage hysteresis loops of FIG. 10*e* and FIG. 10*f* comprise "hidden" logical levels l−1), l1). Such protocols can be used if the information, stored at the "hidden levels" l−1), l1) needs to be protected from undesirable change and other interferences. Any attempt to access these levels l−1), l1) will immediately switch the corresponding information unit to another level l−2), l2) with no possibility of the back restoring. Therefore, the said charge-voltage hysteresis loops provide the security protection of the ferroelectric nanoparticle capacitor-device 100, which is an especially novel feature of our disclosure.

The charge-voltage hysteresis loops of FIG. 10*g* and FIG. 10*h* implement the multilevel Schmitt trigger, required for multiple applications in electronics.

The ferroelectric nanoparticle capacitor-device 100 of FIG. 9*a* or 9*c*, via selection of appropriate sizes and material compositions of the ferroelectric nanoparticles 104*a*, 104*b*, 104*c*, enables the implementation of any preselected charge-voltage hysteresis loop of the charge-voltage hysteresis loops represented in FIG. 10*a*, FIG. 10*b*, FIG. 10*c*, FIG. 10*d*, FIG. 10*e*, FIG. 10*f*, FIG. 10*g*, and FIG. 10*h*.

Controlling external stimuli, for instance, the temperature or strain, as described above in the context of FIG. 7*a*, FIG. 8*b*, the charge-voltage hysteresis loop and the switching sequence between the logical levels/polarization states 106, l+2), l+1), l−1), and l−2) can be selected and modified on-the-fly, i.e. after fabrication of the ferroelectric nanoparticle capacitor-device 100 with given sizes and material compositions of the ferroelectric nanoparticles 104*a*, 104*b*, 104*c*.

Similarly, the charge-voltage hysteresis loop can be controlled for a ferroelectric nanoparticle capacitor-device 100 comprising more than three, for example, four, five, or any larger number of ferroelectric nanoparticles 104*a*, 104*b*, 104*c*. The charge-voltage hysteresis loop can be controlled initially via selection of an appropriate number of appropriate ferroelectric nanoparticles 104*a*, 104*b*, 104*c* and their sizes and material compositions. A later, on-the-fly control is achieved by incorporating a temperature-control element 206 or a force-control element as described above. To ensure a sufficient spacing between the polarization states 106 in terms of total energy W, voltage V and/or charge Q, a smaller number of ferroelectric nanoparticles 104*a*, 104*b*, 104*c* such as up to 10, 5, 4 or three ferroelectric nanoparticles 104*a*, 104*b*, 104*c* is preferable. In other words, the number of polarization states 106 should be limited, e.g., to up to 64, 32, 16, 8, or 5 polarization states 106. A smaller number of ferroelectric nanoparticles 104*a*, 104*b*, 104*c* and/or number of polarization states 106 improves the reliability of the switching and of the readout of the polarization state 106.

Embodiments with more than three ferroelectric nanoparticles 104*a*, 104*b*, 104*c* use the (ferroelectric and/or dielectric) materials described above, as well as the temperature and/or strain ranges described above; also, the remaining device parameters are similar to the ones described above. Devices comprising any other number of the nanoparticles and their configuration realize multilevel logic units possessing more complicated routes for the charge-voltage hysteresis loops enabling, therefore, even higher levels of the neuromorphic computing.

FIG. 11 illustrates a method 400 for operating the ferroelectric nanoparticle capacitor-device 100.

The ferroelectric nanoparticle capacitor-device 100 is similar to one of the ferroelectric nanoparticle capacitor-devices 100 described above in the context of FIG. 1, FIG. 7*a*, FIG. 8*a*, FIG. 9*a*, or FIG. 9*c*. Any of those ferroelectric nanoparticle capacitor-devices 100 provides a maximumferroelectric-polarization state (and a minimum-ferroelectric-polarization state) with a maximum (and a minimum) ferroelectric polarization, such that no polarization state of the at least three polarization states has a ferroelectric polarization larger (or smaller, respectively) than the maximum-ferroelectric-polarization state (or the minimum-ferroelectric-polarization state). Moreover, any of those ferroelectric nanoparticle capacitor-devices 100 provides an intermediate-ferroelectric-polarization state with a polarization between the minimum ferroelectric polarization and the maximum ferroelectric polarization.

At step 402, the method 400 comprises selecting an intermediate-ferroelectric-polarization state.

At step 404, the method 400 comprises selecting a first voltage or charge according to the selected intermediate-ferroelectric-polarization state.

At step 406, the method 400 comprises applying the first voltage or charge to a conductive element 102, 112 of the pair to set the ferroelectric nanoparticles 104*a*, 104*b*, 104*c* to the selected intermediate-ferroelectric-polarization state.

Preferentially, the current polarization state 106 of the ferroelectric nanoparticles 104*a*, 104*b*, 104*c* is detected based on a voltage of at least one of the conductive elements 102, 112. For this purpose, the voltage between the conductive elements 102, 112 is measured, which corresponds to the voltage in the charge-voltage hysteresis loop described above. For a given device, the measured voltage is thus directly associated with the polarization state 106.

Alternatively, the current polarization state 106 of the ferroelectric nanoparticles 104*a*, 104*b*, 104*c* is detected based on a change of the voltage of at least one of the conductive elements 102, 112, such as by counting jumps of the voltage of at least one of the conductive elements 102, 112. For this purpose, the voltage measurement is performed continuously to identify the change of the voltage.

Amongst the two options of selecting a first voltage or charge, the selecting the first charge is preferred. Correspondingly, applying the first charge is preferred.

The other conductive element 102, 112 of the pair is kept at a constant electrical charge.

Preferably, the first voltage or charge is applied between one of the conductive elements (i.e., the second conductive element 112 described above) and the additional conductive element 202, 302 described above, preferably using the charge control device 114 described above.

When applied to a ferroelectric nanoparticle capacitor-device 100 with a charge-voltage hysteresis loop as illustrated in FIG. 10*a*, the voltage or charge applied to the conductive element 102, 112 is continuously increased until the first voltage or charge is reached. To reach a polarization state 106 with a larger or smaller (i.e., more negative) polarization, a larger or smaller voltage or charge is applied to the conductive element 102, 112.

Thereafter, the voltage or charge applied to the conductive element 102, 112 may be reduced to zero whereupon the polarization state 106 remains preserved. The ferroelectric nanoparticle capacitor-device 100 thus implements a non-volatile memory, which can be used to store information without external power, voltage, or charge support.

When applied to a ferroelectric nanoparticle capacitor-device 100 with a charge-voltage hysteresis loop as illustrated in FIG. 10*b*, to reach the intermediate-ferroelectric-polarization state l+1), the voltage or charge applied to the conductive element 102, 112 first needs to be increased to a positive value sufficient to reach state l+2). Thereafter, the applied voltage is decreased until the negative first voltage or charge is reached, setting the polarization to state l+1). An inverse voltage or charge sequence is applied to the conductive element 102, 112 to reach the intermediate-ferroelectric-polarization state l−1).

When applied to a ferroelectric nanoparticle capacitor-device 100 with a charge-voltage hysteresis loop as illustrated in FIG. 10*c*, to reach the intermediate-ferroelectric-polarization state l+1), the voltage or charge applied to the conductive element 102, 112 first needs to be increased to a positive value sufficient to reach state l+2). Thereafter, the applied voltage is decreased to a negative value until the ferroelectric nanoparticles 104*a*, 104*b*, 104*c* switch to the state l−1). Thereafter, the applied voltage is increased until the positive first voltage or charge is reached, setting the polarization 106 to state l+1). An inverse voltage or charge sequence is applied to the conductive element 102, 112 to reach the intermediate-ferroelectric-polarization state l−1).

In a ferroelectric nanoparticle capacitor-device 100 with a "hidden state", such as illustrated in the context of FIG. 5*b*, FIG. 10*e*, FIG. 10*f*, heating the ferroelectric nanoparticles 104*a*, 104*b*, 104*c* and/or applying a mechanical force to the ferroelectric nanoparticles 104*a*, 104*b*, 104*c* can be used to set the polarization state 106 of the ferroelectric nanoparticles 104*a*, 104*b*, 104*c* to the hidden state.

Alternatively, heating the ferroelectric nanoparticles 104*a*, 104*b*, 104*c* and/or applying a mechanical force to the ferroelectric nanoparticles 104*a*, 104*b*, 104*c* is used to modify the charge-voltage hysteresis loop of the ferroelectric nanoparticle capacitor-device 100.

The description of the embodiments and the figures merely serve to illustrate the techniques of the present disclosure and the beneficial effects associated therewith but should not imply any limitation. The scope of the disclosure is to be determined from the appended claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A ferroelectric nanoparticle capacitor-device, comprising:

a pair of conductive elements including a first conductive element and second conductive element;

a dielectric separator material electrically insulating the pair of conductive elements from each other;

a charge control device configured to control a charge on the second conductive element of the pair of conductive elements, the charge control device comprising an additional conductive element that is electrically insulated from the pair of conductive elements;

a dielectric spacer separating the additional conductive element from the first conductive element;

a voltage source configured to apply a voltage between the additional conductive element and the second conductive element, the first conductive element being electrically floating; and a plurality of ferroelectric nanoparticles arranged between the pair of conductive elements and configured to provide respective individual polarization states;

wherein respective sizes of the ferroelectric nanoparticles along any direction do not exceed 100 nm;

wherein the plurality of ferroelectric nanoparticles are configured to provide at least three polarization states each referring to a projection of a total ferroelectric polarization of the plurality of ferroelectric nanoparticles onto an axis;

wherein the at least three polarization states refer to combinations of the individual polarization states of the plurality of ferroelectric nanoparticles, the individual polarization states referring to projections of the individual polarizations of the plurality of ferroelectric nanoparticles onto the axis.

2. The ferroelectric nanoparticle capacitor-device of claim 1, wherein the plurality of ferroelectric nanoparticles includes:

at most 10 ferroelectric nanoparticles;

at most 5 ferroelectric nanoparticles;

at most 3 ferroelectric nanoparticles;

exactly 3 ferroelectric nanoparticles; or exactly 2 ferroelectric nanoparticles.

3. The ferroelectric nanoparticle capacitor-device of claim 1, wherein each conductive element of the pair of conductive elements comprises respective surfaces facing each other, and wherein a respective surface area of each of the respective surfaces exceeds an overall surface-projected area of the plurality of ferroelectric nanoparticles, the overall surface-projected area corresponding to a total area of a projection of the plurality of ferroelectric nanoparticles onto the surface of the first conductive element.

4. The ferroelectric nanoparticle capacitor-device of claim 1, wherein individual ferroelectric nanoparticles of the plurality of ferroelectric nanoparticles are spaced apart from each other.

5. The ferroelectric nanoparticle capacitor-device of claim 4, the dielectric separator material being arranged between the individual ferroelectric nanoparticles.

6. The ferroelectric nanoparticle capacitor-device of claim 1, wherein a first ferroelectric nanoparticle of the plurality of ferroelectric nanoparticles has a first size and a second ferroelectric nanoparticle of the plurality of ferroelectric nanoparticles has a second size, and wherein the first size is larger than the second size.

7. The ferroelectric nanoparticle capacitor-device of claim 6, wherein the first size is larger than the second size by one of:

at least 10%;

at least 30%;

at least 50%; and at least a factor of two.

8. The ferroelectric nanoparticle capacitor-device of claim 1, wherein the plurality of ferroelectric nanoparticles comprises respective monodomain ferroelectric states.

9. The ferroelectric nanoparticle capacitor-device of claim 1, wherein the first conductive element of the pair of conductive elements is configured to carry a constant electrical charge.

10. The ferroelectric nanoparticle capacitor-device of claim 1, further comprising at least one of:

a temperature-control element implemented as a heater and configured to control and/or change a temperature of the plurality of ferroelectric nanoparticles; and a force control element based on a piezoelectric substrate and configured to control and/or change a mechanical force applied to the plurality of ferroelectric nanoparticles.

11. A method for operating a ferroelectric nanoparticle capacitor-device, wherein the ferroelectric nanoparticle capacitor-device comprises:

a pair of conductive elements including a first conductive element and second conductive element;

a dielectric separator material that electrically insulates the pair of conductive elements from each other;

a charge control device configured to control a charge on the second conductive element of the pair of conductive elements, the charge control device comprising an additional conductive element that is electrically insulated from the pair of conductive elements;

a dielectric spacer separating the additional conductive element from the first conductive element;

a voltage source configured to apply a voltage between the additional conductive element and the second conductive element, the first conductive element being electrically floating; and a plurality of ferroelectric nanoparticles arranged between the pair of conductive elements and configured to provide respective individual polarization states;

wherein respective sizes of the ferroelectric nanoparticles along any direction do not exceed 100 nm;

wherein the plurality of ferroelectric nanoparticles are configured to provide at least three polarization states having different total ferroelectric polarizations each referring to a projection of the total ferroelectric polarization of the plurality of ferroelectric nanoparticles onto an axis;

wherein the at least three polarization states refer to combinations of the individual polarization states of the plurality of ferroelectric nanoparticles, the individual polarization states referring to projections of the individual polarizations of the plurality of ferroelectric nanoparticles onto the axis; and wherein the at least three polarization states includes a minimum-ferroelectric-polarization state, a maximum-ferroelectric-polarization state, and at least one intermediate-ferroelectric-polarization state;

the method comprising:

selecting a selected intermediate-ferroelectric-polarization state;

selecting a first voltage or charge according to the selected intermediate-ferroelectric-polarization state; and applying the first voltage or charge to one of the pair of conductive elements to set the plurality of ferroelectric nanoparticles to the selected intermediate-ferroelectric-polarization state.

12. The method of claim 11, further comprising:

prior to applying the first voltage or charge to set the ferroelectric nanoparticles to the selected intermediate-ferroelectric-polarization state:

providing the plurality of ferroelectric nanoparticles in a first polarization state of the at least three polarization states, wherein the first polarization state is different from the selected intermediate-ferroelectric-polarization state;

selecting a second voltage or charge according to the selected intermediate-ferroelectric-polarization state and/or according to the first polarization state; and applying the second voltage or charge to the one of the pair of conductive elements to set the ferroelectric nanoparticles from the first polarization state to a second polarization state of the at least three polarization states;

wherein the second polarization state is different from both the first polarization state and the selected intermediate-ferroelectric-polarization state.

13. The method of claim 11, wherein the selected intermediate-ferroelectric-polarization state is a remanent state.

14. The method of claim 11, wherein the method further comprises reducing the first voltage or charge applied to the one of the pair of conductive elements thereby preserving the set intermediate-ferroelectric-polarization state.

15. The method of claim 14, wherein reducing the voltage or charge includes reducing the voltage by one of:

at least 30%;

at least a factor of 2;

at least a factor of 3;

at least a factor of 5;

at least a factor of 10; and at least a factor of 100.

* * * * *